(12) United States Patent
Huang et al.

(10) Patent No.: US 10,615,195 B2
(45) Date of Patent: Apr. 7, 2020

(54) ARRAY SUBSTRATE WITH OPENINGS IN INSULATION LAYER FOR AUXILIARY ELECRODE

(71) Applicant: Au Optronics Corporation, Hsinchu (TW)

(72) Inventors: Shu-Hao Huang, Taichung (TW); Chin-Chuan Liu, Taichung (TW); Sung-Yu Su, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 39 days.

(21) Appl. No.: 15/784,211

(22) Filed: Oct. 16, 2017

(65) Prior Publication Data

US 2019/0035825 A1   Jan. 31, 2019

(30) Foreign Application Priority Data

Jul. 25, 2017 (TW) .............................. 106124955 A

(51) Int. Cl.
*H01L 27/12* (2006.01)
*G02F 1/1333* (2006.01)
(Continued)

(52) U.S. Cl.
CPC ........ *H01L 27/1288* (2013.01); *G02F 1/1368* (2013.01); *G02F 1/133345* (2013.01);
(Continued)

(58) Field of Classification Search
CPC ............. H01L 27/1288; H01L 27/1244; H01L 27/1248; G02F 1/133345; G02F 1/136227
(Continued)

(56) References Cited

U.S. PATENT DOCUMENTS 8,330,163 B2   12/2012   Chen et al.
2011/0049521 A1   3/2011   Chen et al.
(Continued)

FOREIGN PATENT DOCUMENTS

CN   101101893   1/2008
CN   101650525   2/2010
(Continued)

*Primary Examiner* — Robert T Huber
(74) *Attorney, Agent, or Firm* — JCIPRNET

(57) ABSTRACT

A method for fabricating an array substrate is provided. A gate insulation layer, first and second gates and a first interlayered insulation layer are formed on first and second active layers in order. A photolithography and etching process is performed by using a photo mask to form first to fourth contact holes in the gate insulation layer and the first interlayered insulation layer. First and second sources and first and second drains which are respectively connected to the first and second active layers through the first to fourth contact holes are formed. A second interlayered insulation layer is formed. Another photolithography and etching process is performed by using said photo mask to form first to third openings and a via hole in the second interlayered insulation layer, wherein along a normal direction, the third opening and the first contact hole are overlapped, the via hole and the second contact hole are overlapped, the first opening and the third contact hole are overlapped, and the second opening and the fourth contact hole are overlapped.

2 Claims, 35 Drawing Sheets

(51) Int. Cl.
*G02F 1/1362* (2006.01)
*G02F 1/1368* (2006.01)
*H01L 29/786* (2006.01)

(52) U.S. Cl.
CPC ...... *G02F 1/136227* (2013.01); *H01L 27/124* (2013.01); *H01L 27/127* (2013.01); *H01L 27/1222* (2013.01); *H01L 27/1244* (2013.01); *H01L 27/1248* (2013.01); *H01L 27/1259* (2013.01); *H01L 29/78621* (2013.01); *H01L 29/78633* (2013.01); *H01L 29/78675* (2013.01); *G02F 2001/136231* (2013.01); *G02F 2201/123* (2013.01); *G02F 2202/104* (2013.01)

(58) Field of Classification Search
USPC .......................................................... 257/72
See application file for complete search history.

(56) References Cited

U.S. PATENT DOCUMENTS

| | | | | |
|---|---|---|---|---|
| 2014/0159067 | A1* | 6/2014 | Sakariya | H01L 24/24 257/88 |
| 2015/0008400 | A1* | 1/2015 | Kim | H01L 27/3279 257/40 |
| 2016/0240604 | A1 | 8/2016 | Kim | |
| 2017/0186831 | A1* | 6/2017 | Nam | H01L 27/3272 |

FOREIGN PATENT DOCUMENTS

| | | |
|---|---|---|
| CN | 103280429 | 9/2013 |
| CN | 104282724 | 1/2015 |
| CN | 105185743 | 12/2015 |
| CN | 105390507 | 3/2016 |
| TW | 201109768 | 3/2011 |
| TW | 201344314 | 11/2013 |
| TW | 201715371 | 5/2017 |

* cited by examiner

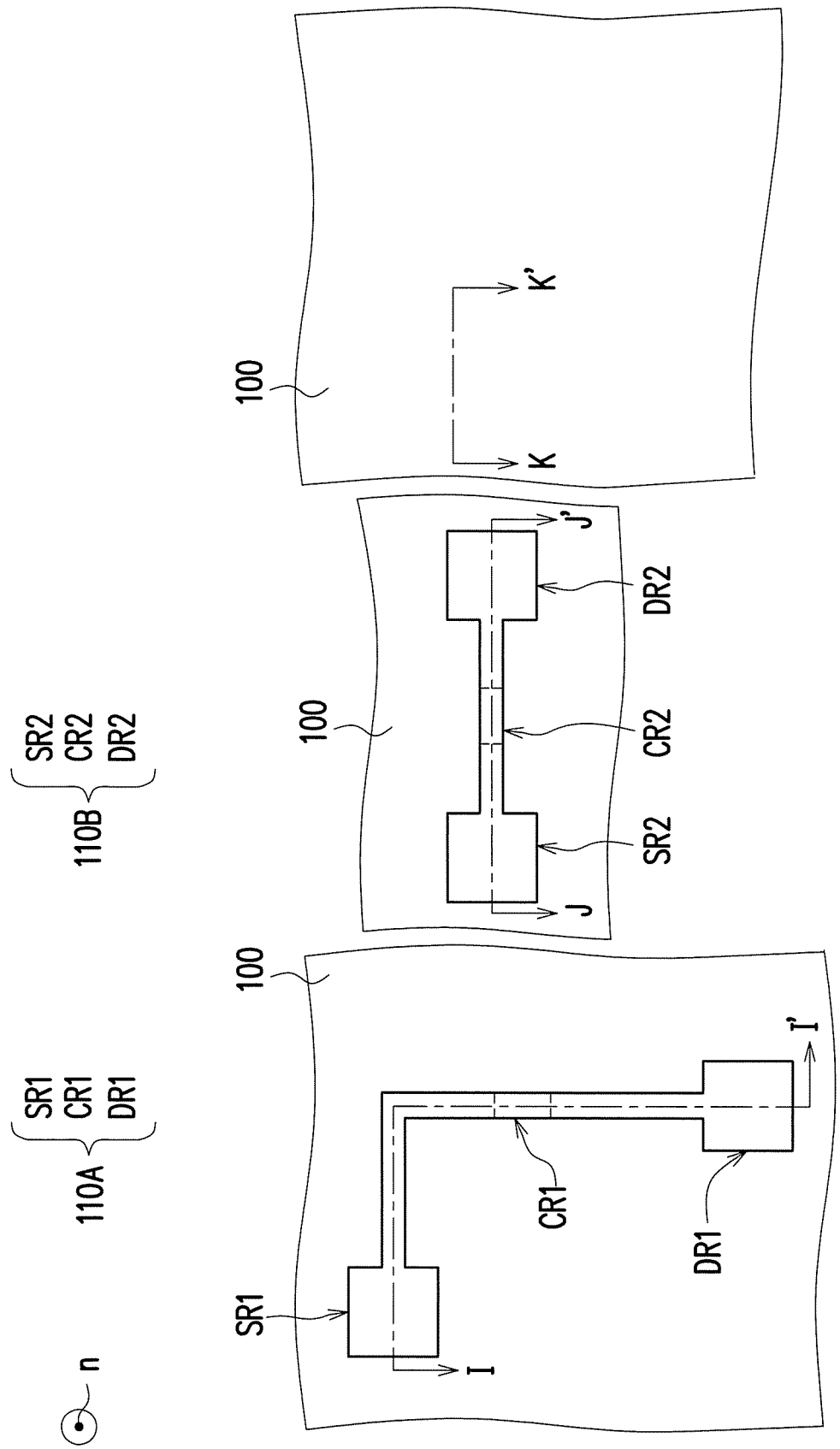

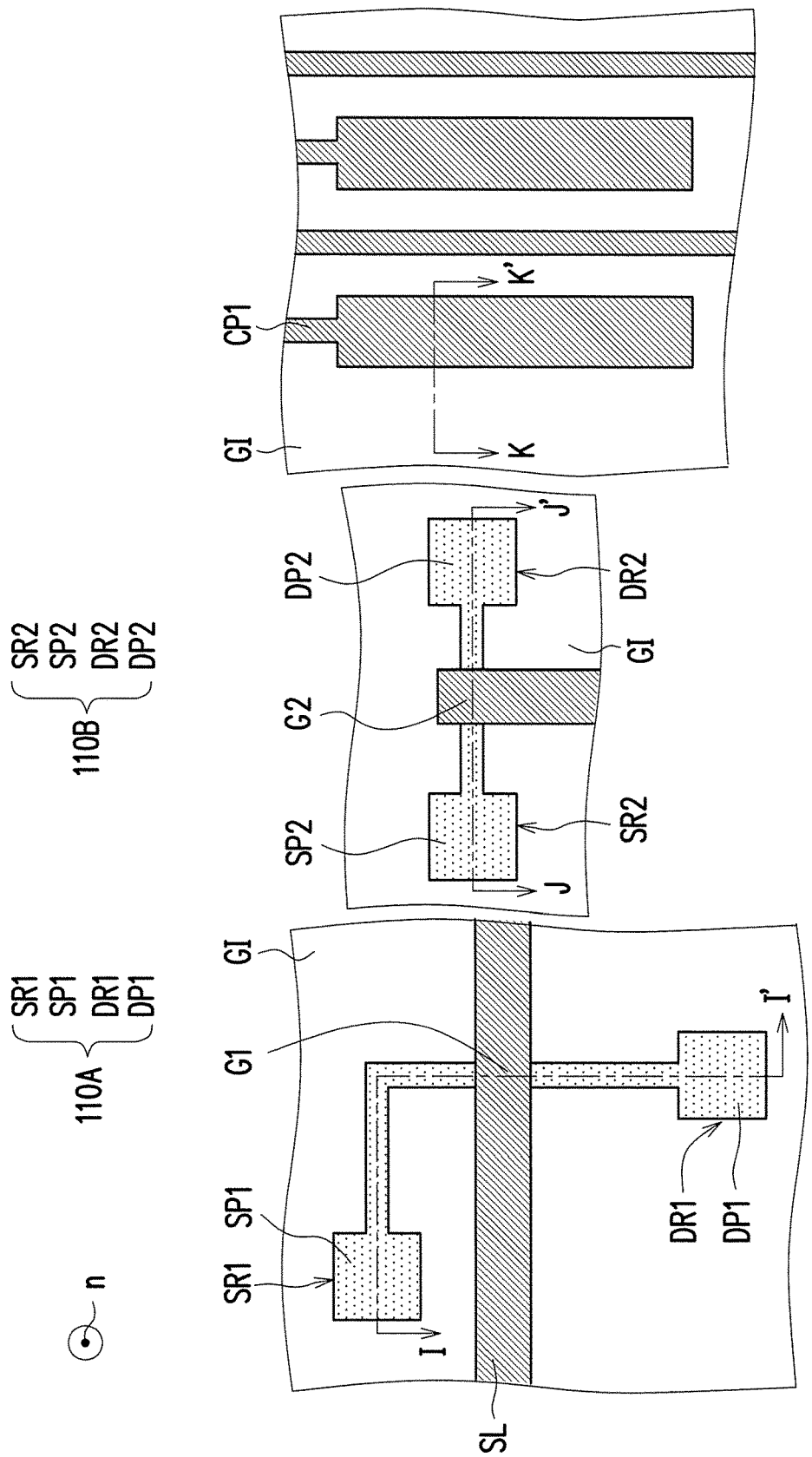

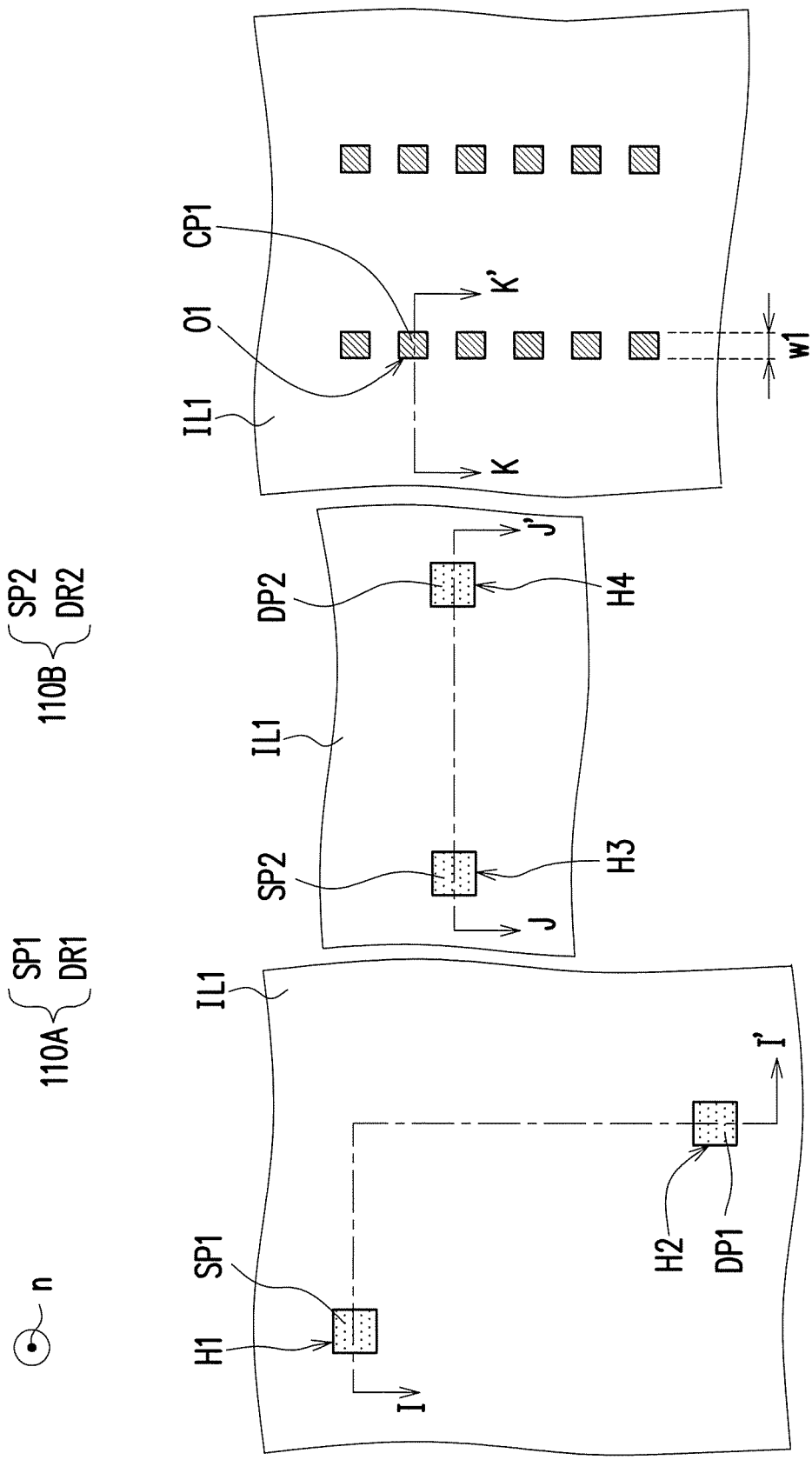

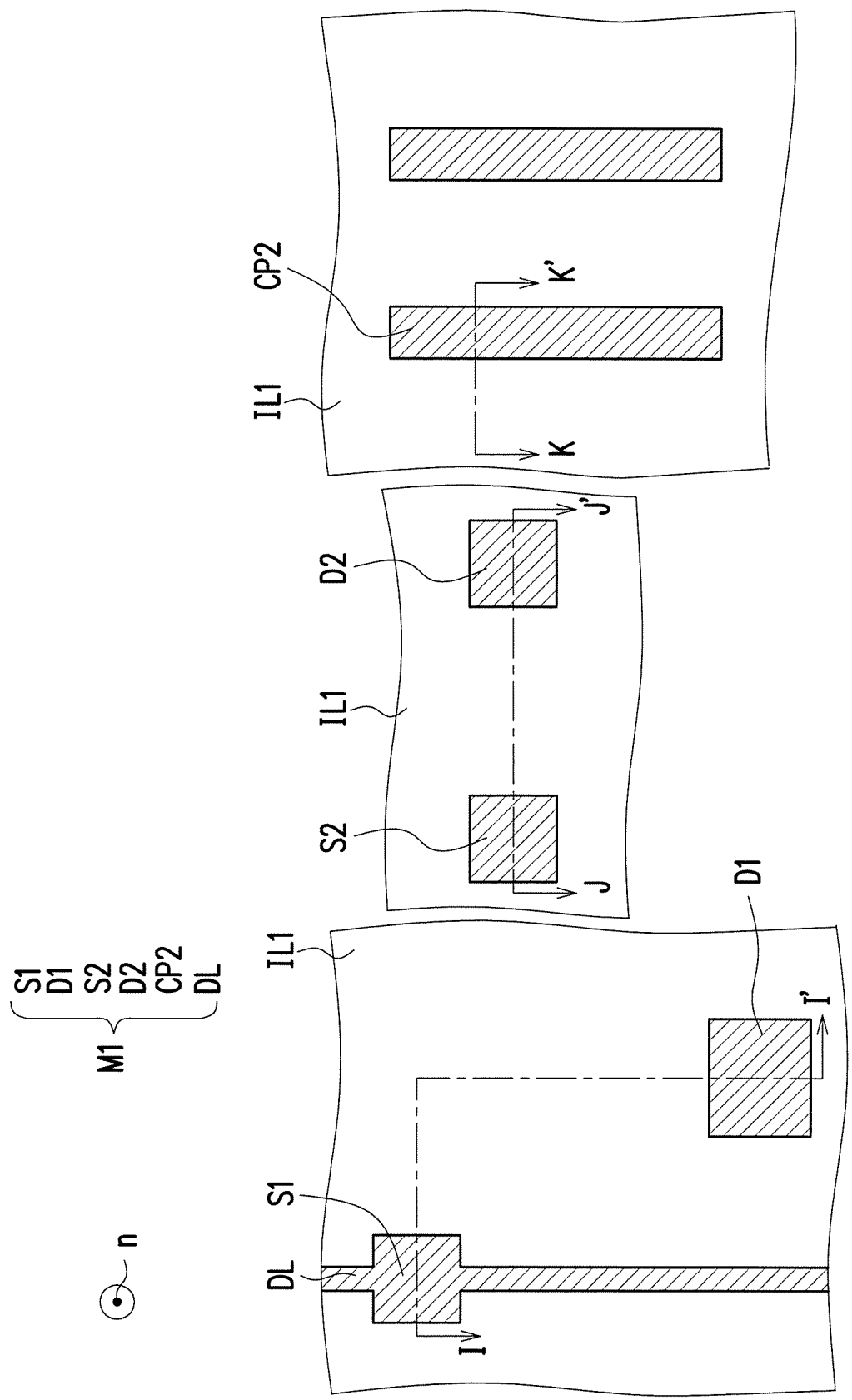

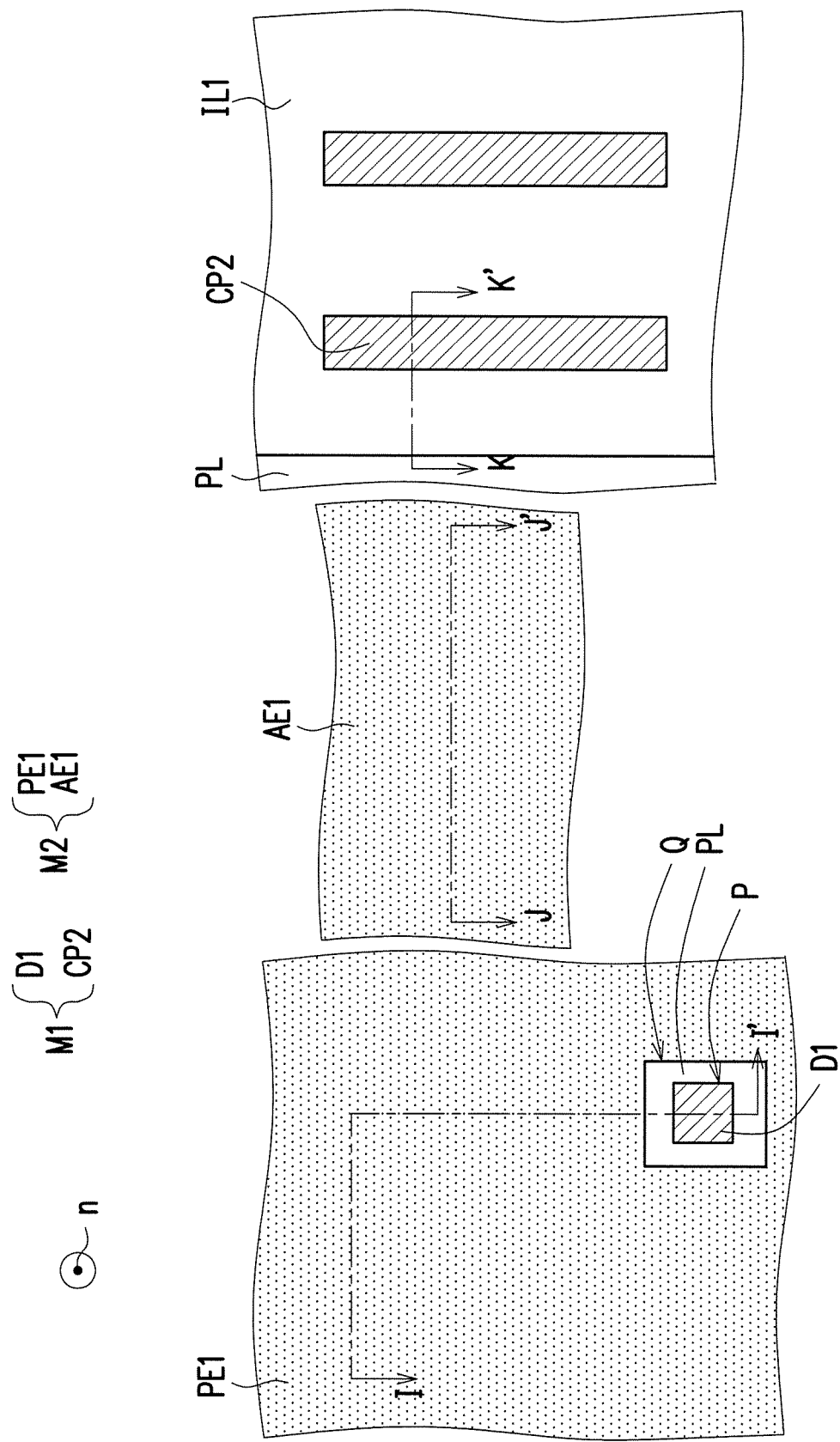

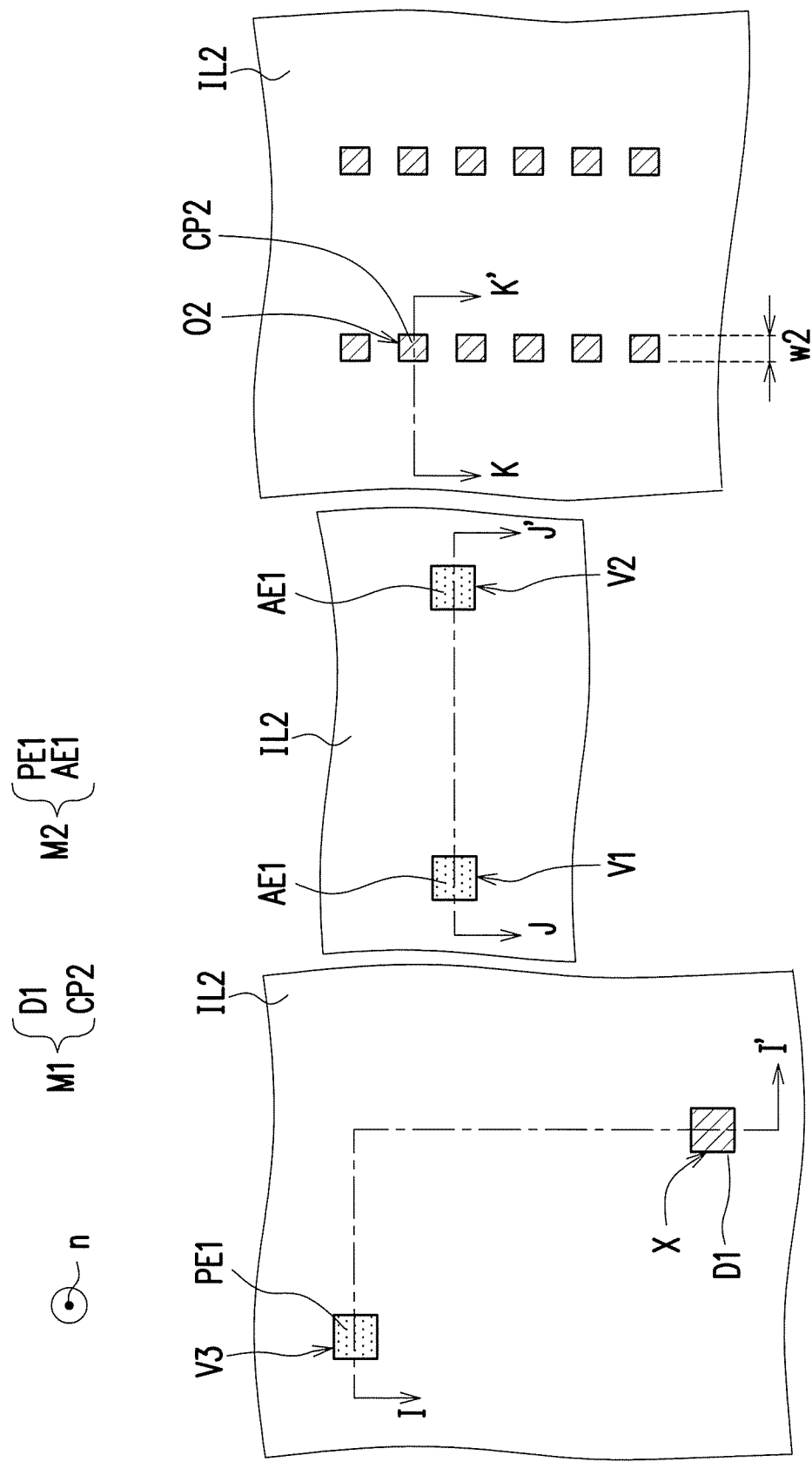

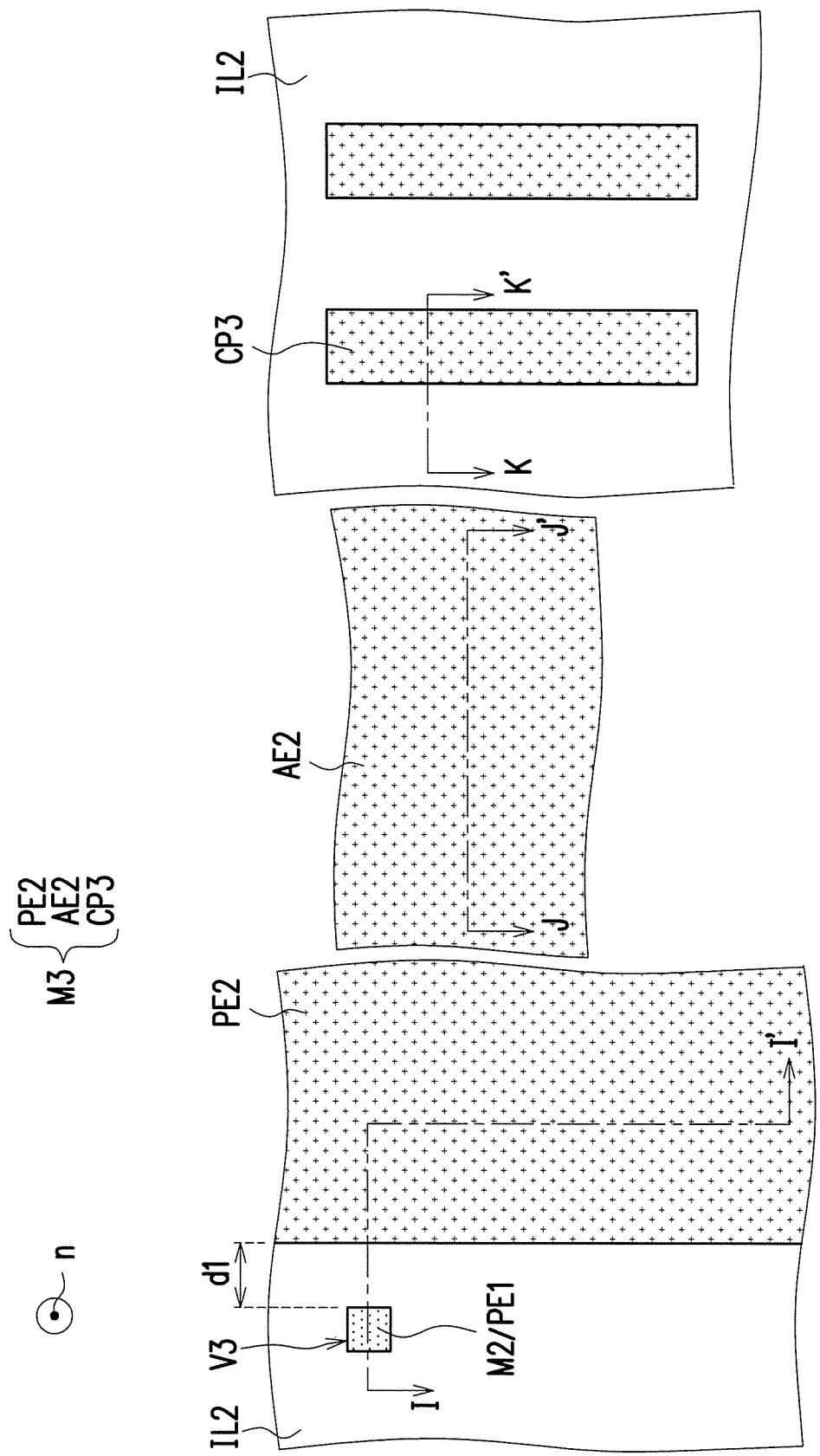

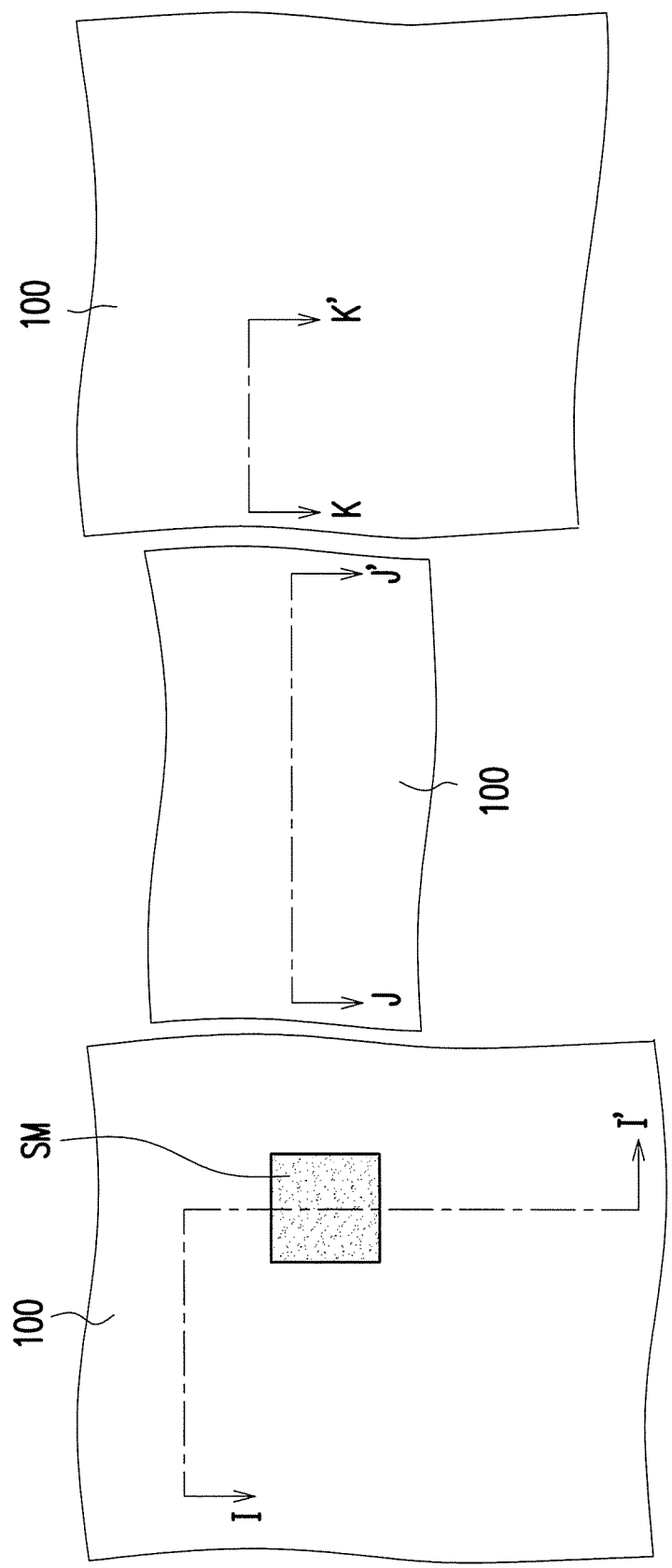

ARRAY SUBSTRATE WITH OPENINGS IN INSULATION LAYER FOR AUXILIARY ELECRODE

CROSS-REFERENCE TO RELATED APPLICATION

This application claims the priority benefit of Taiwan application serial no. 106124955, filed on Jul. 25, 2017. The entirety of the above-mentioned patent application is hereby incorporated by reference herein and made a part of this specification.

BACKGROUND OF THE INVENTION

1. Field of the Invention

The invention relates to an array substrate and a method for fabricating thereof.

2. Description of Related Art

Compared to an amorphous silicon thin film transistor (TFT), a low temperature poly-silicon thin film transistor (LTPS-TFT) has advantages such as high apparatus ratio and high resolution as the LTPS-TFT consumes less power and has greater electron mobility. LTPS liquid crystal displays thus gradually become the mainstream in the development of consumer product design. Nevertheless, at least eight photo masks are required in the existing method for fabricating the LTPS liquid crystal displays, fabricating costs of the LTPS liquid crystal displays are consequently less likely to be reduced owing to high costs of the photo masks, and competitiveness of the products is thereby lowered.

SUMMARY OF THE INVENTION

An embodiment of the invention provides an array substrate and a method for fabricating thereof that saves the number of the photo masks used for lowering fabricating costs.

In an embodiment of the invention, a method for fabricating an array substrate includes following steps: forming a first active layer at a display region of a substrate and a second active layer at a driving circuit region of the substrate, wherein the first active layer has a first channel predetermined region, a first source doped predetermined region and a first drain doped predetermined region, and the second active layer has a second channel predetermined region, a second source doped predetermined region and a second drain doped predetermined region; forming a gate insulation layer on the first active layer and the second active layer; forming a first gate and a second gate on the gate insulation layer, wherein the first gate and the first channel predetermined region are overlapped along a normal direction, and the second gate and the second channel predetermined region are overlapped along the normal direction; forming a first interlayered insulation layer on the first gate and the second gate; performing a photolithography and etching process by using a photo mask to form a first contact hole, a second contact hole, a third contact hole and a fourth contact hole in the gate insulation layer and the first interlayered insulation layer, wherein the first contact hole exposes at least a portion of the first source doped predetermined region, the second contact hole exposes at least a portion of the first drain doped predetermined region, the third contact hole exposes at least a portion of the second source doped predetermined region, and the fourth contact hole exposes at least a portion of the second drain doped predetermined region; forming a first conductor layer including a first source, a first drain, a second source and a second drain, wherein the first source, the first drain, the second source, and the second drain are respectively in contact with the first source doped predetermined region, the first drain doped predetermined region, the second source doped predetermined region and the second drain doped predetermined region through the first contact hole, the second contact hole, the third contact hole and the fourth contact hole; forming a second conductor layer above the first conductor layer; forming a second interlayered insulation layer on the second conductor layer; performing another photolithography and etching process by using said photo mask to form a first opening, a second opening, a third opening and a via hole in the second interlayered insulation layer, wherein the third opening and the first contact hole are overlapped along the normal direction, the via hole and the second contact hole are overlapped along the normal direction, the first opening and the third contact hole are overlapped along the normal direction, the second opening and the fourth contact hole are overlapped along the normal direction; and forming a third conductor layer on the second interlayered insulation layer.

In an embodiment of the invention, an array substrate includes a substrate, an active element, a driving element, a first interlayered insulation layer, a first auxiliary electrode and a second interlayered insulation layer. The substrate has a display region and a driving circuit region. The active element is located at the display region. The driving element located at the driving circuit region. The first interlayered insulation layer is at least located at the display region. The first auxiliary electrode located at the driving circuit region. The second interlayered insulation layer is located above the active element and the driving element, wherein the second interlayered insulation layer has a first opening and a second opening corresponding to the driving circuit region.

Based on the above, in the method for fabricating the array substrate according to an embodiment of the invention, the same photo mask is used to form the first to fourth contact holes and the at least one first bonding region opening and to form the first to third openings, the via hole and the at least one second bonding region opening, meaning that the same photo mask is used in two photolithography and etching processes. Therefore, in the method for fabricating the array substrate, the number of the photo masks used is saved and fabricating costs are lowered.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A, FIG. 3B and FIG. 3C are schematic top views of FIG. 2B, wherein cross-sectional positions of FIG. 2B respectively correspond to positions of a sectional line I-I' of FIG. 3A, a sectional line J-J' of FIG. 3B, and a section line K-K' of FIG. 3C.

FIG. 4A, FIG. 4B and FIG. 4C are schematic top views of FIG. 2D, wherein cross-sectional positions of FIG. 2D respectively correspond to positions of a sectional line I-I' of FIG. 4A, a sectional line J-J' of FIG. 4B, and a sectional line K-K' of FIG. 4C.

FIG. 5A, FIG. 5B and FIG. 5C are schematic top views of FIG. 2F, wherein cross-sectional positions of FIG. 2F respectively correspond to positions of a sectional line I-I' of FIG. 5A, a sectional line J-J' of FIG. 5B, and a sectional line K-K' of FIG. 5C.

FIG. 6A, FIG. 6B and FIG. 6C are schematic top views of FIG. 2H, wherein cross-sectional positions of FIG. 2H respectively correspond to positions of a sectional line I-I' of FIG. 6A, a sectional line J-J' of FIG. 6B, and a sectional line K-K' of FIG. 6C.

FIG. 8A, FIG. 8B and FIG. 8C are schematic top views of FIG. 2L, wherein cross-sectional positions of FIG. 2L respectively correspond to positions of a sectional line I-I' of FIG. 8A, a sectional line J-J' of FIG. 8B, and a sectional line K-K' of FIG. 8C.

FIG. 9A, FIG. 9B and FIG. 9C are schematic top views of FIG. 2N, wherein cross-sectional positions of FIG. 2N respectively correspond to positions of a sectional line I-I' of FIG. 9A, a sectional line J-J' of FIG. 9B, and a sectional line K-K' of FIG. 9C.

FIG. 10A, FIG. 10B and FIG. 10C are schematic top views of FIG. 2P, wherein cross-sectional positions of FIG. 2P respectively correspond to positions of a sectional line I-I' of FIG. 10A, a sectional line J-J' of FIG. 10B, and a sectional line K-K' of FIG. 10C.

FIG. 12A, FIG. 12B and FIG. 12C are schematic top views of FIG. 11B, wherein cross-sectional positions of FIG. 11B respectively correspond to positions of a sectional line I-I' of FIG. 12A, a sectional line J-J' of FIG. 12B, and a sectional line K-K' of FIG. 12C.

DESCRIPTION OF THE EMBODIMENTS

In order to reduce the number of photo masks to be used, at least one embodiment of the invention provides an array substrate capable of achieving the foregoing advantage. Hereinafter, several embodiments are introduced to describe the array substrate of the invention in detail as an example to prove that the invention can actually be realized.

Figure 1:
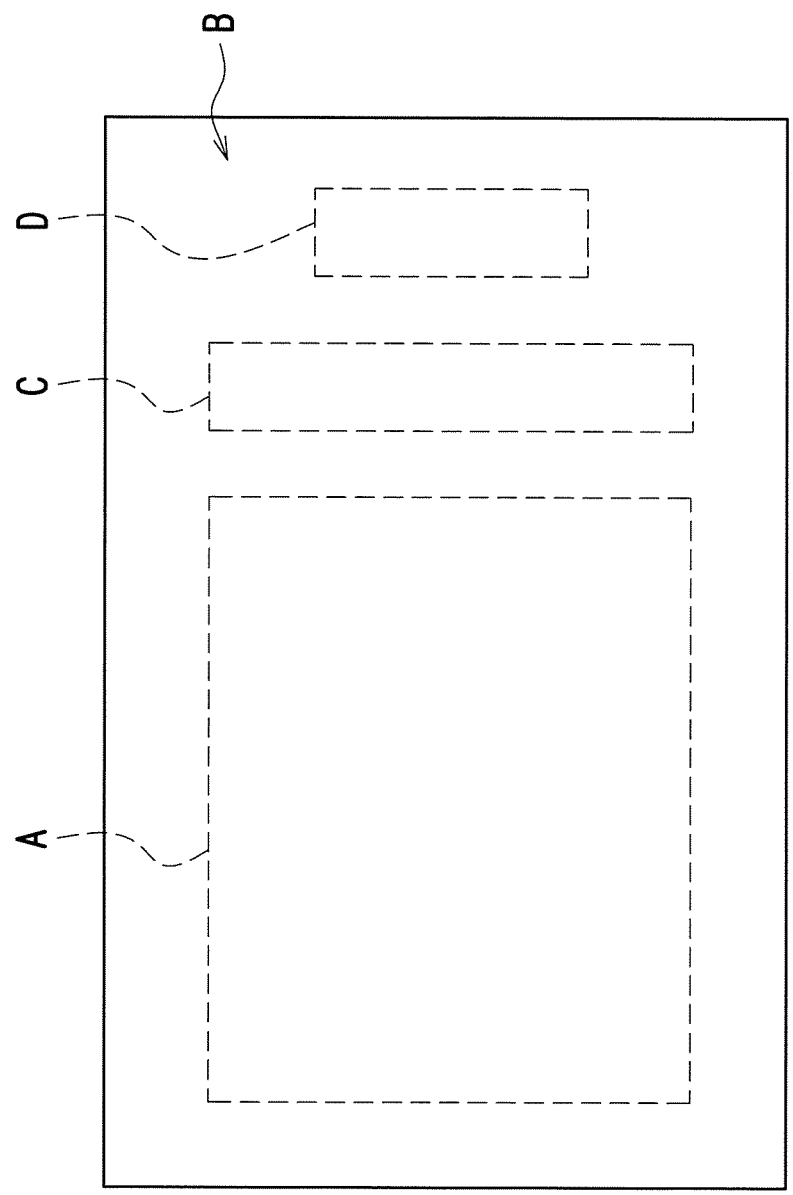
FIG. 1 is a schematic top view of an array substrate according to an embodiment of the invention.

FIG. 1 is a schematic top view of an array substrate according to an embodiment of the invention. Referring to FIG. 1, an array substrate 10 may have a display region A and a periphery region B located around the display region A, wherein the periphery region B may include a driving circuit region C and a bonding region D located at a side of the driving circuit region C.

In order to explain the technical content of the array substrate 10 of the present embodiment in detail, the following description in association with FIG. 2A to FIG. 2P, FIG. 3A, FIG. 3B, FIG. 3C, FIG. 4A, FIG. 4B, FIG. 4C, FIG. 5A, FIG. 5B, FIG. 5C, FIG. 6A, FIG. 6B, FIG. 6C, FIG. 7A, FIG. 7B, FIG. 7C, FIG. 8A, FIG. 8B, FIG. 8C, FIG. 9A, FIG. 9B, FIG. 9C, FIG. 10A, FIG. 10B and FIG. 10C further illustrates the method for fabricating the array substrate 10.

Figure 2A:
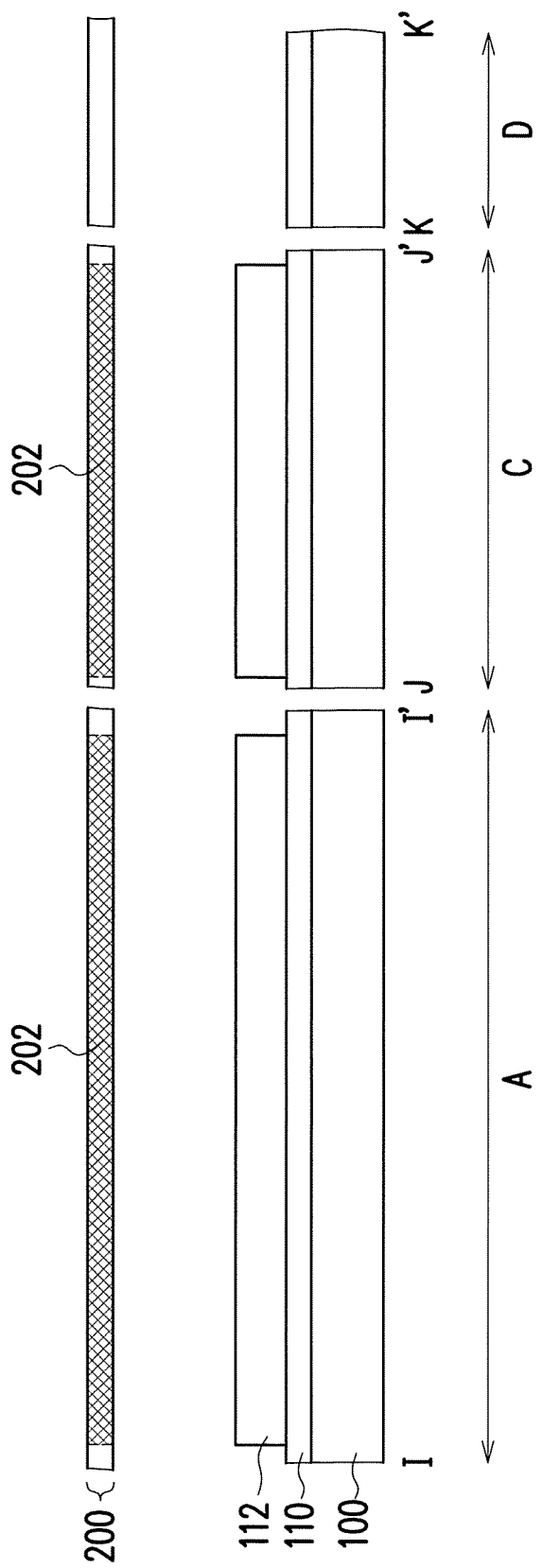
FIG. 2A to FIG. 2P are schematic cross-sectional views of a process for fabricating a portion of an array substrate according to an embodiment of the invention.
Figure 2B:
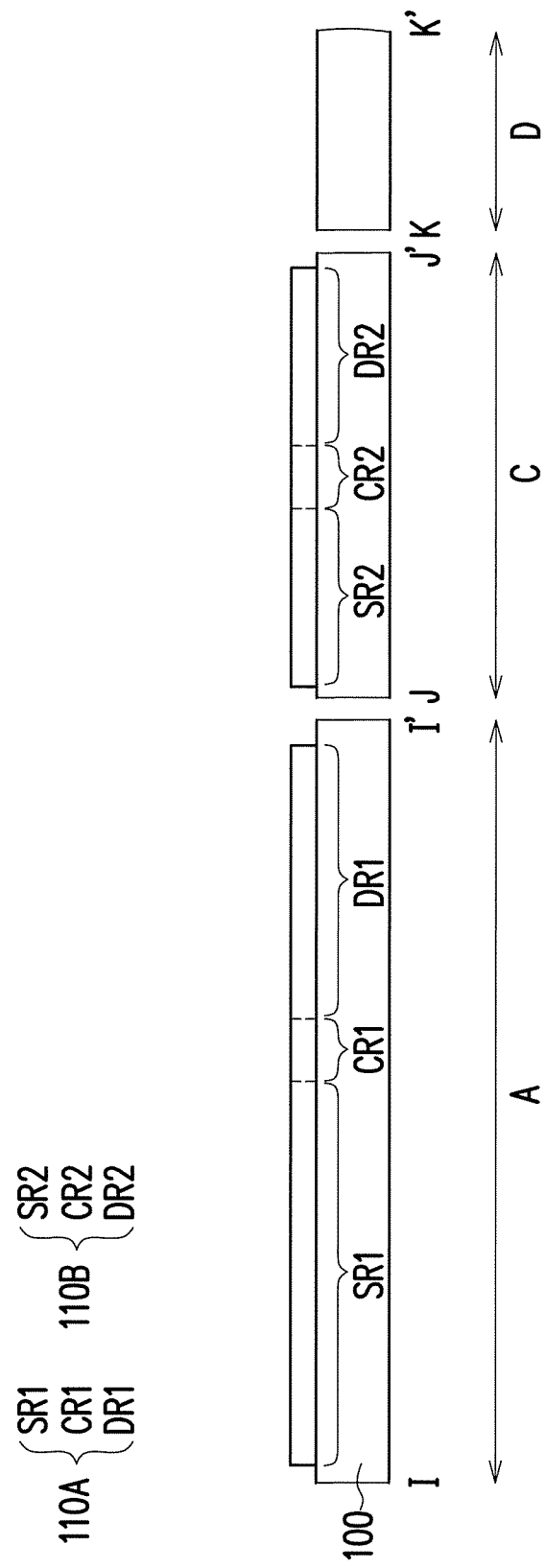
Figure 2C:
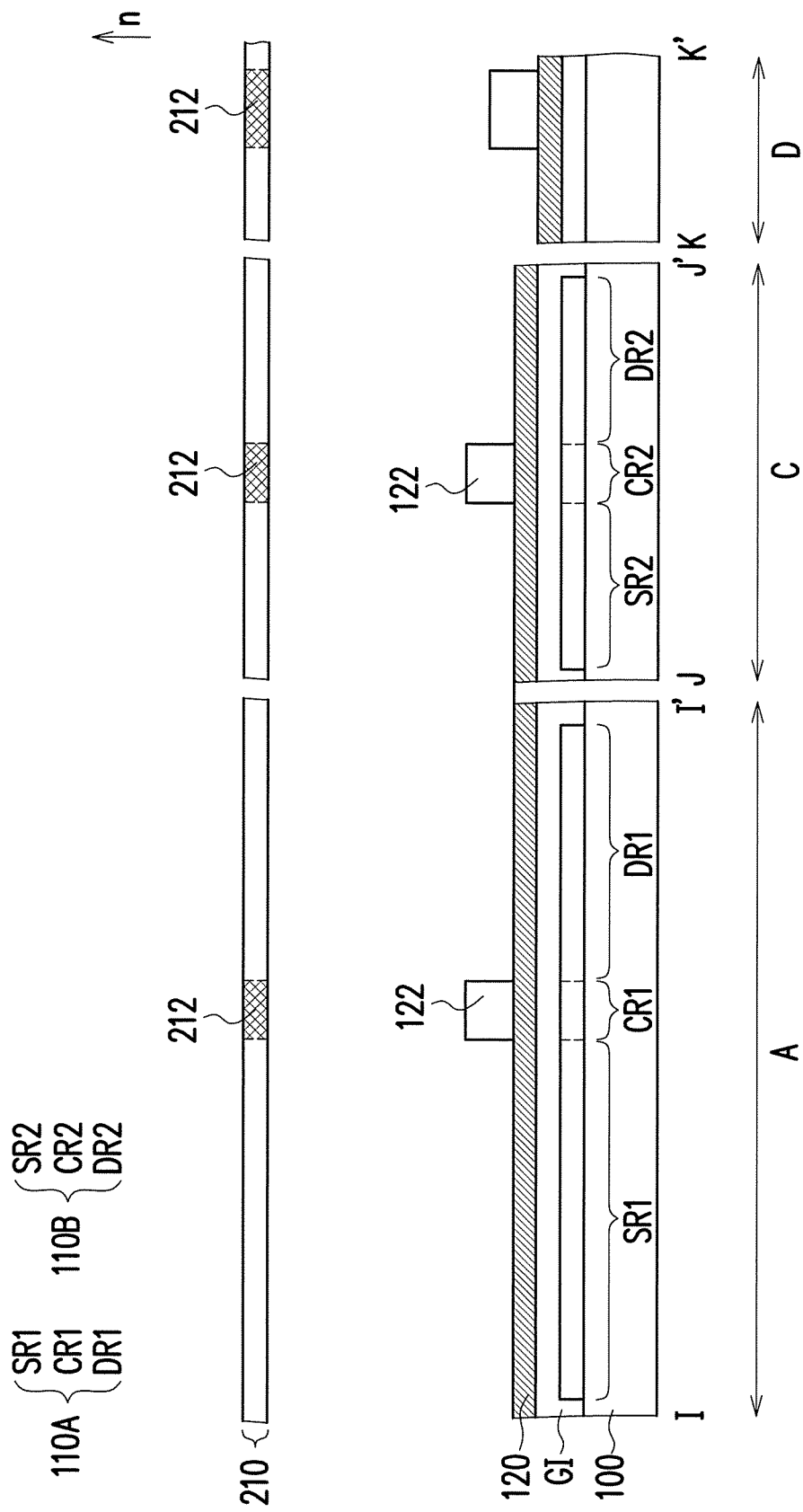
Figure 2D:
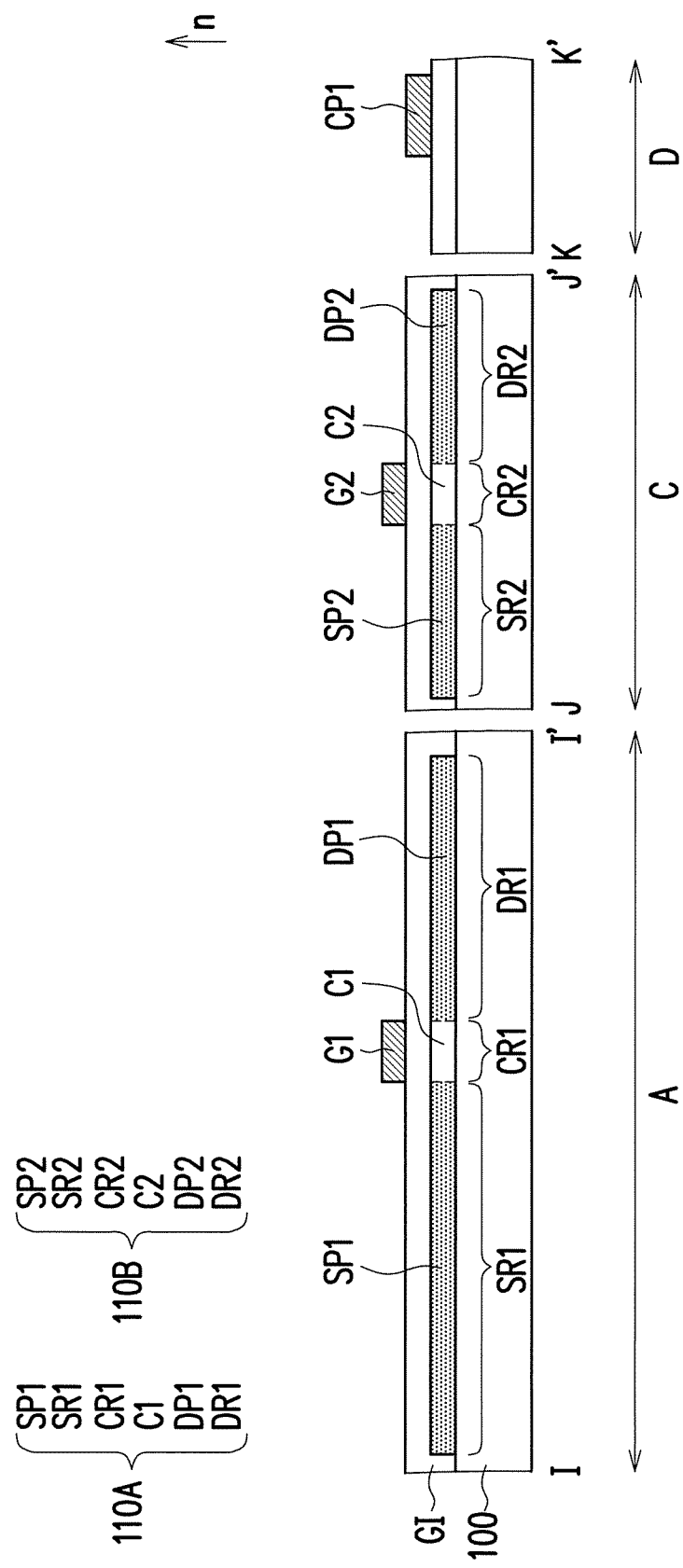
Figure 2E:
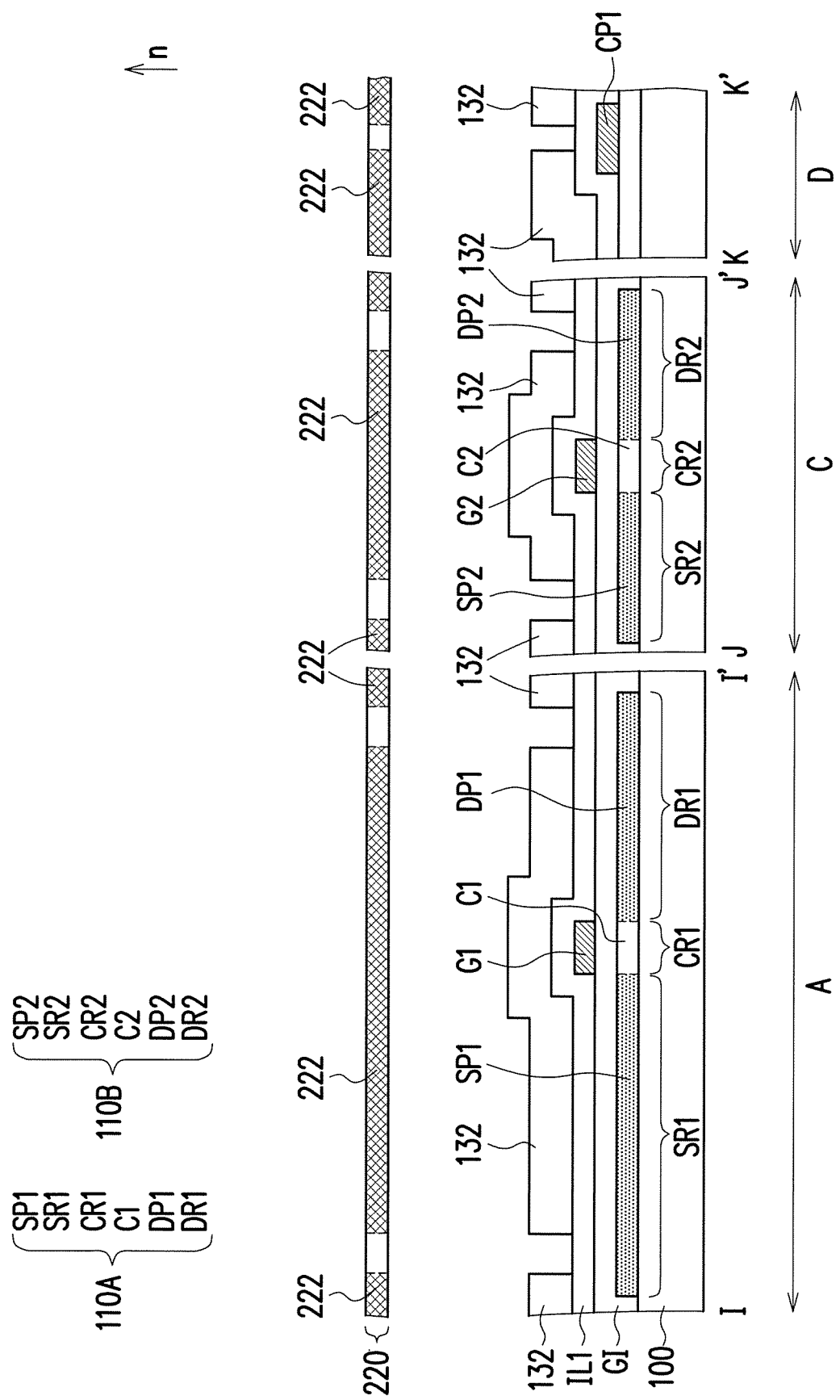
Figure 2F:
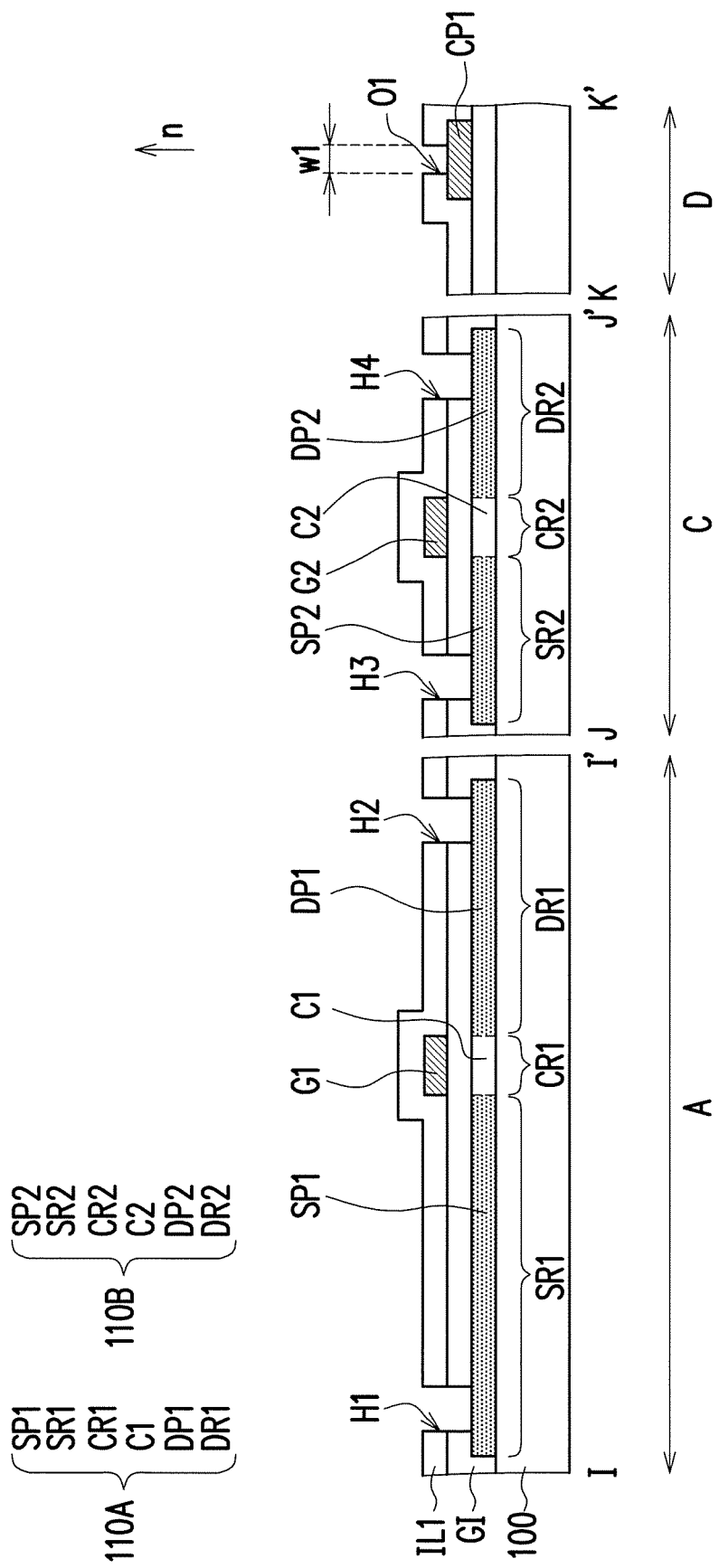
Figure 2G:
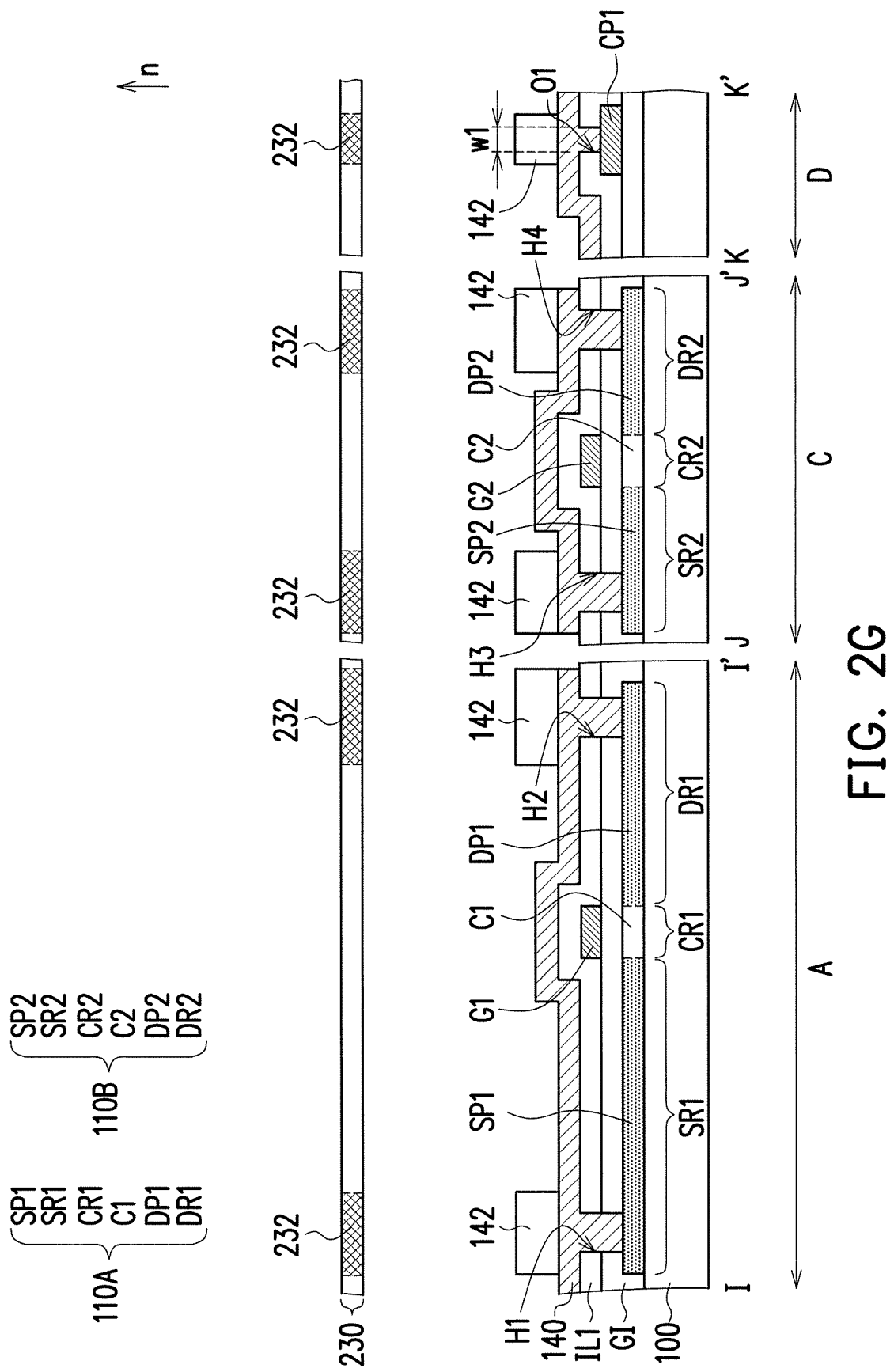
Figure 2H:
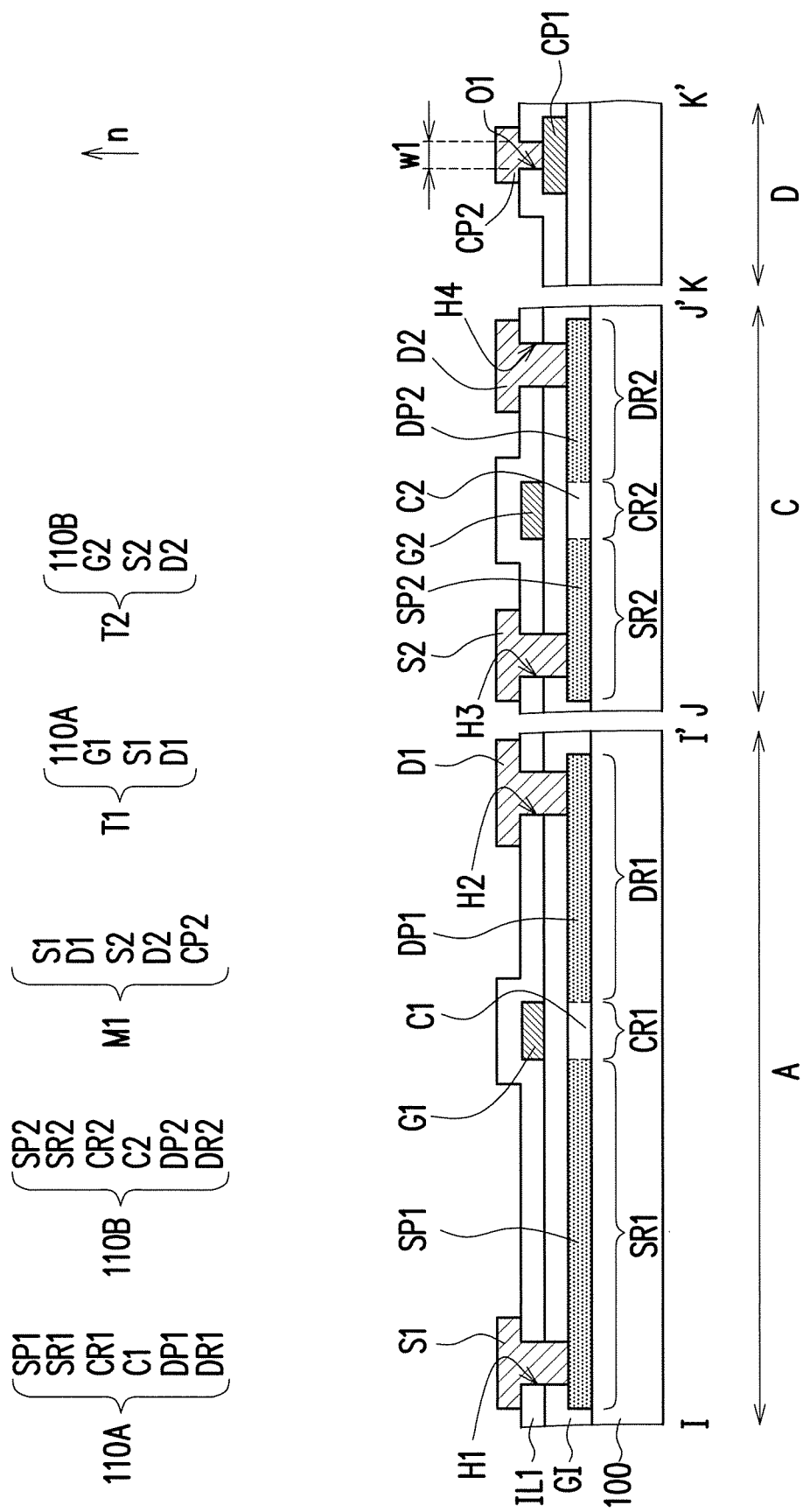
Figure 2I:
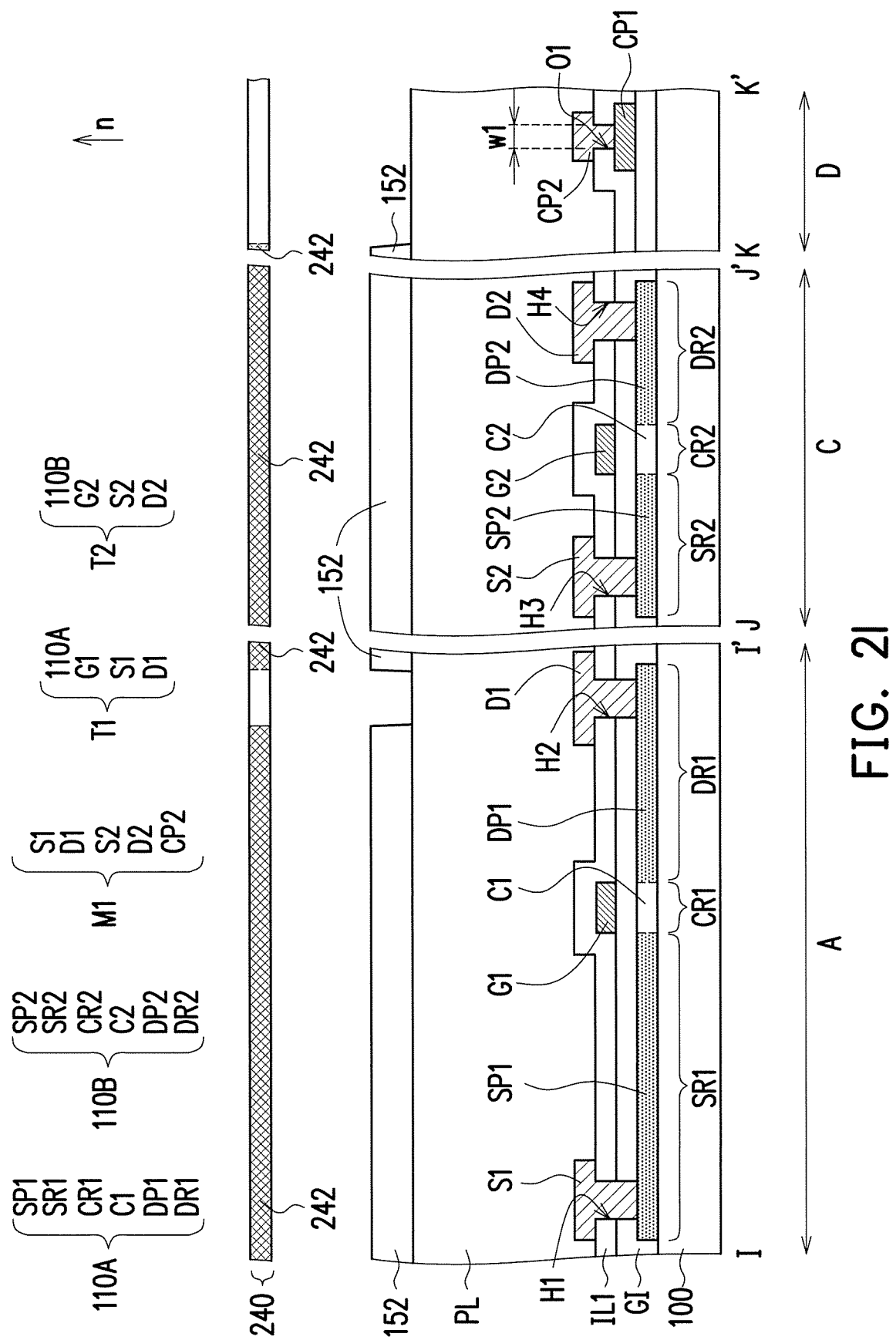
Figure 2J:
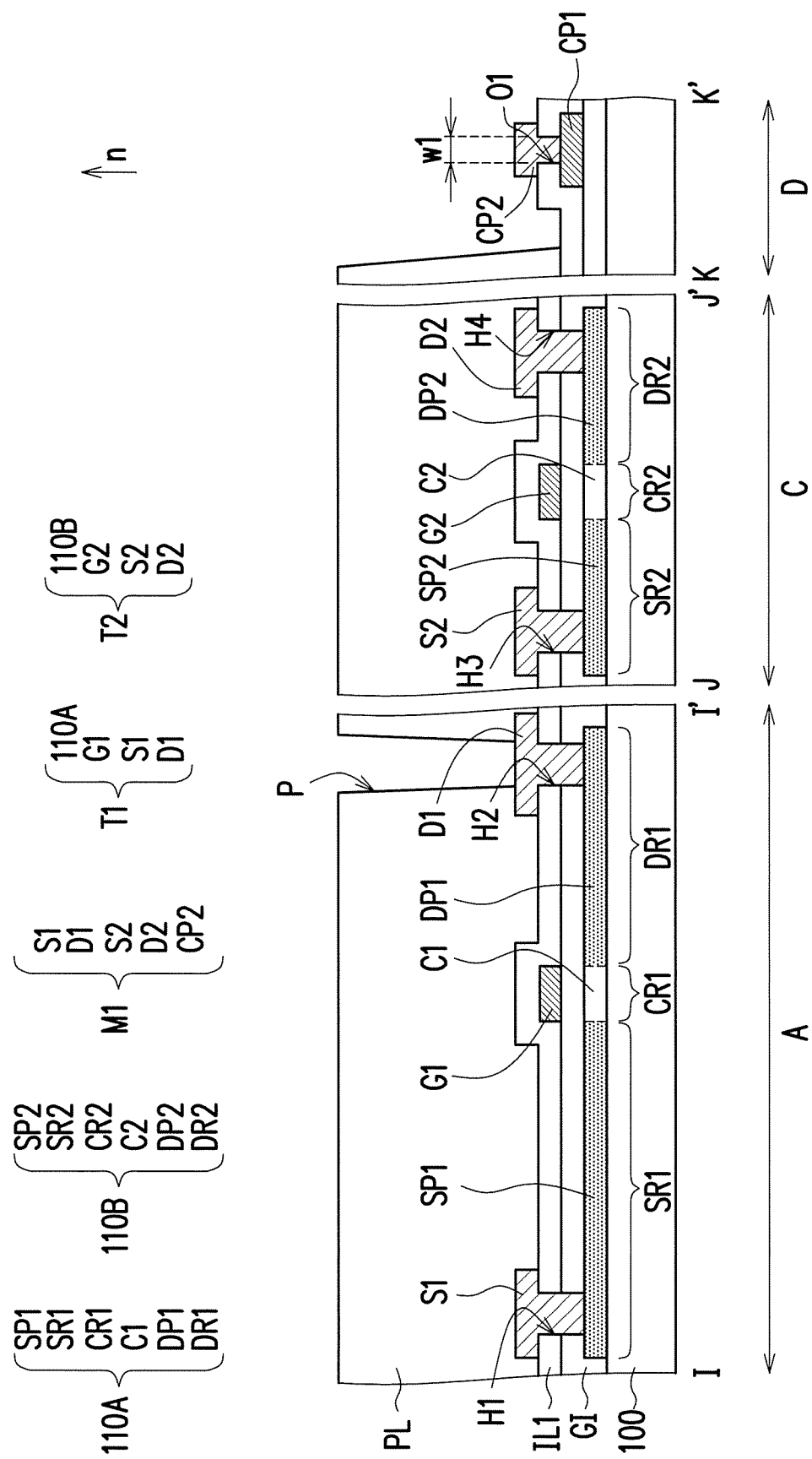
Figure 2K:
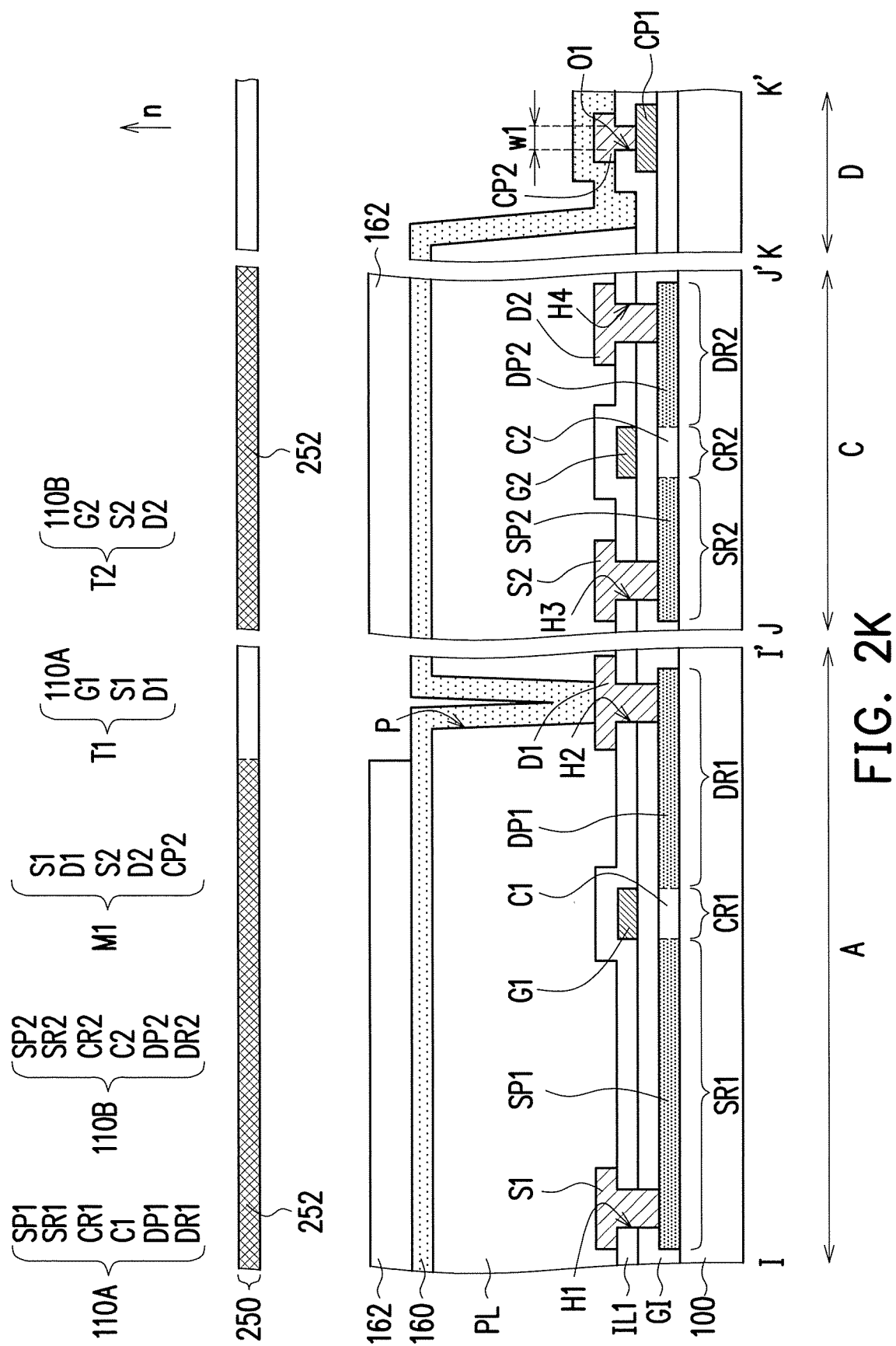
Figure 2L:
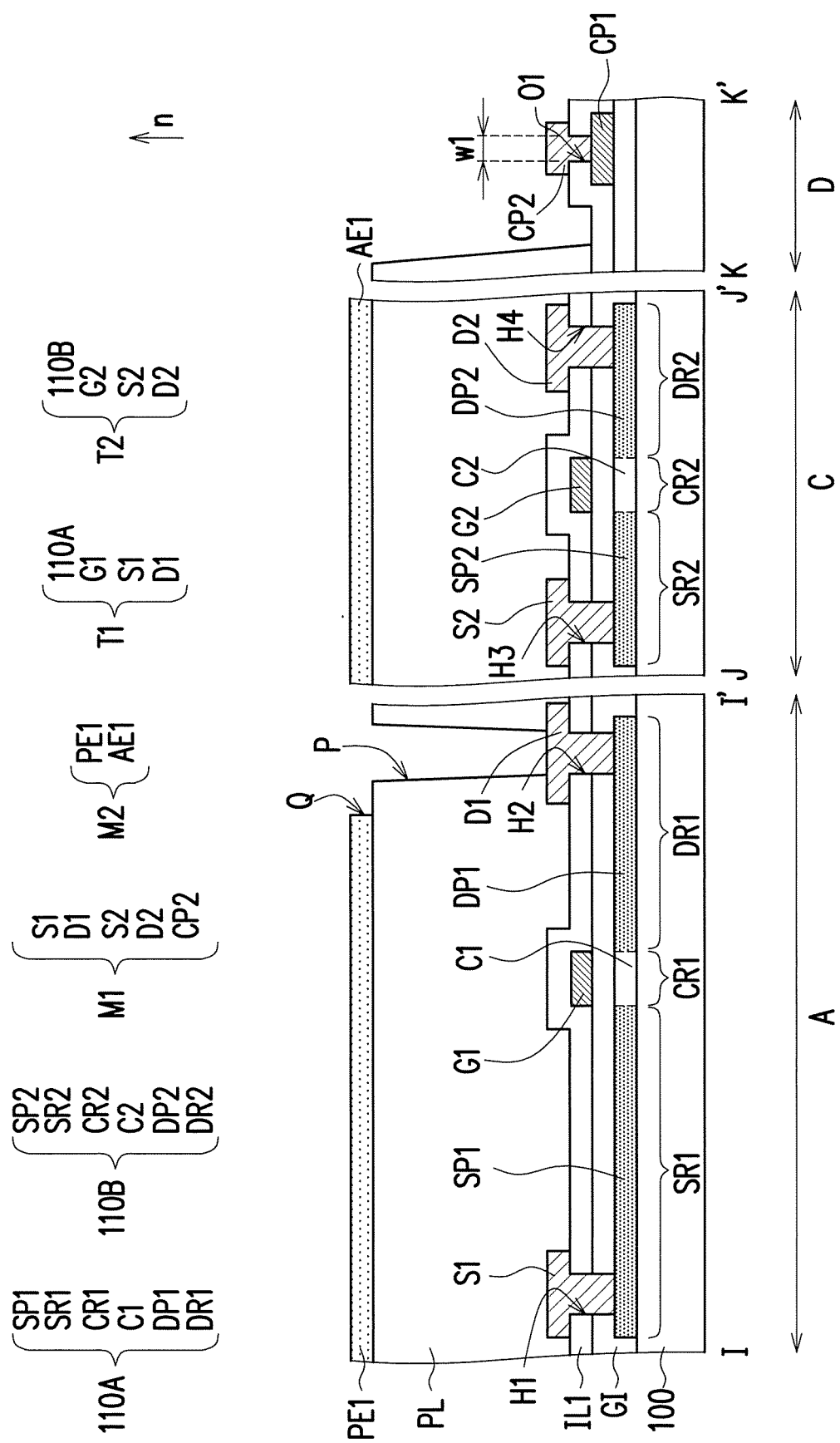
Figure 2M:
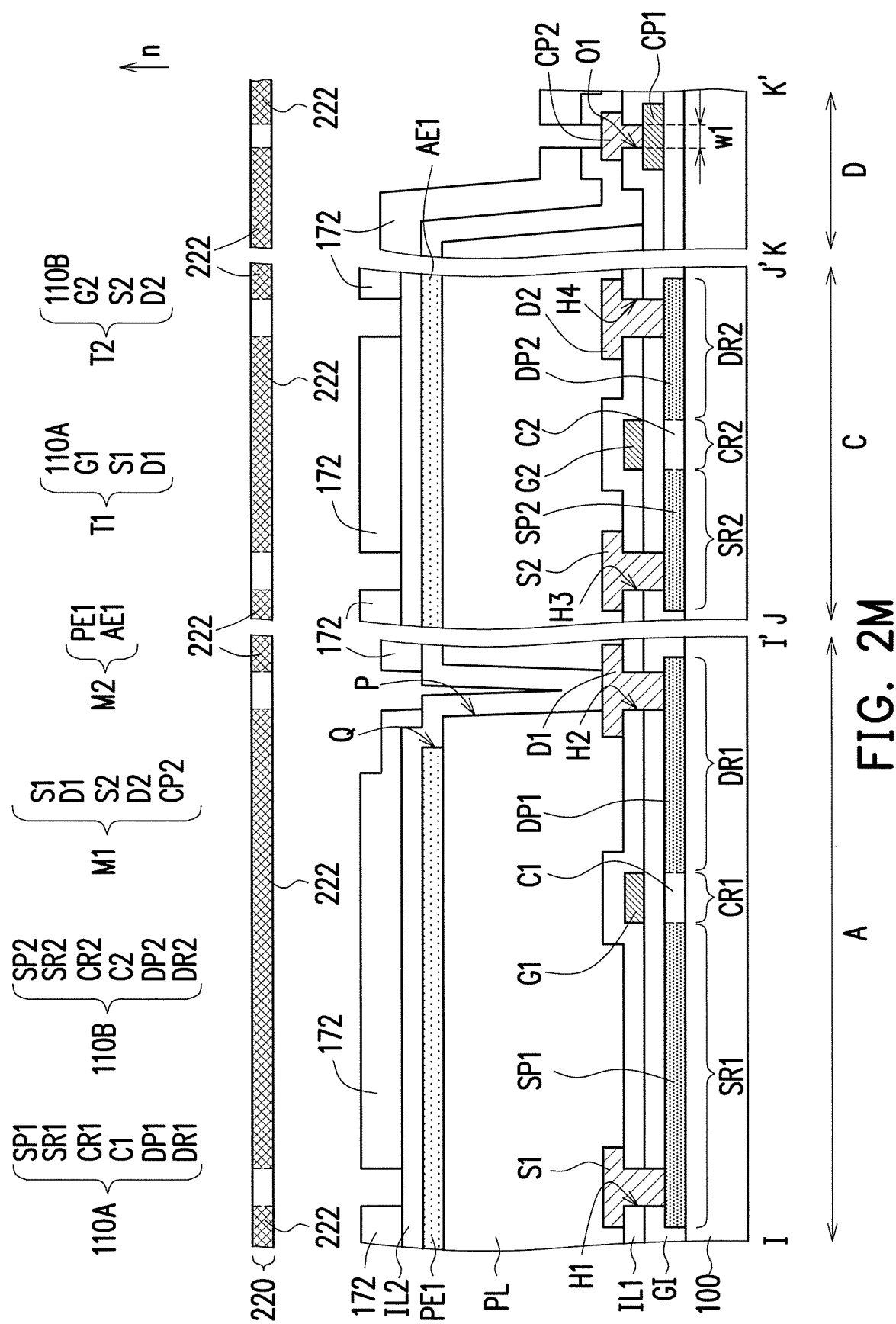
Figure 2N:
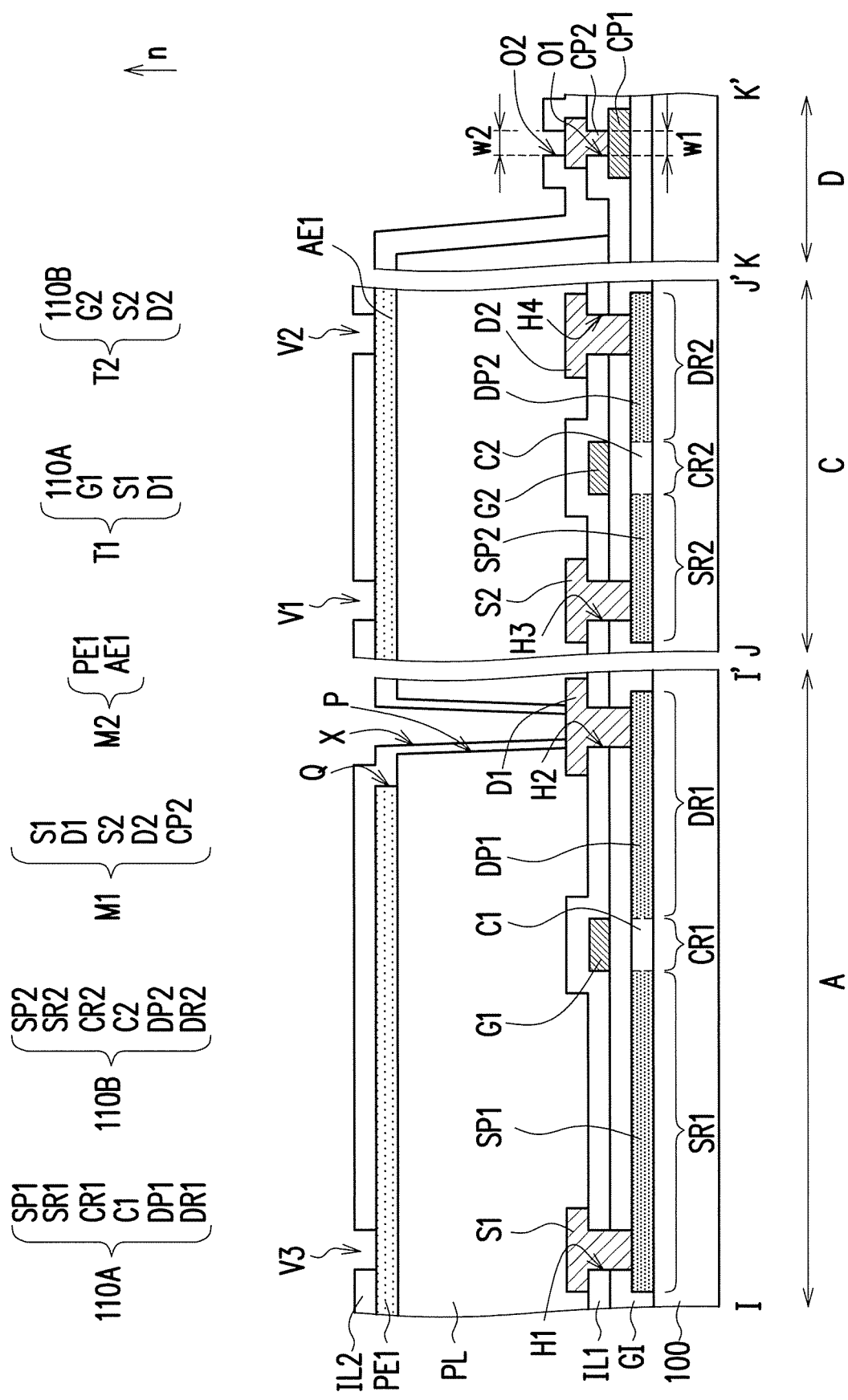
Figure 20:
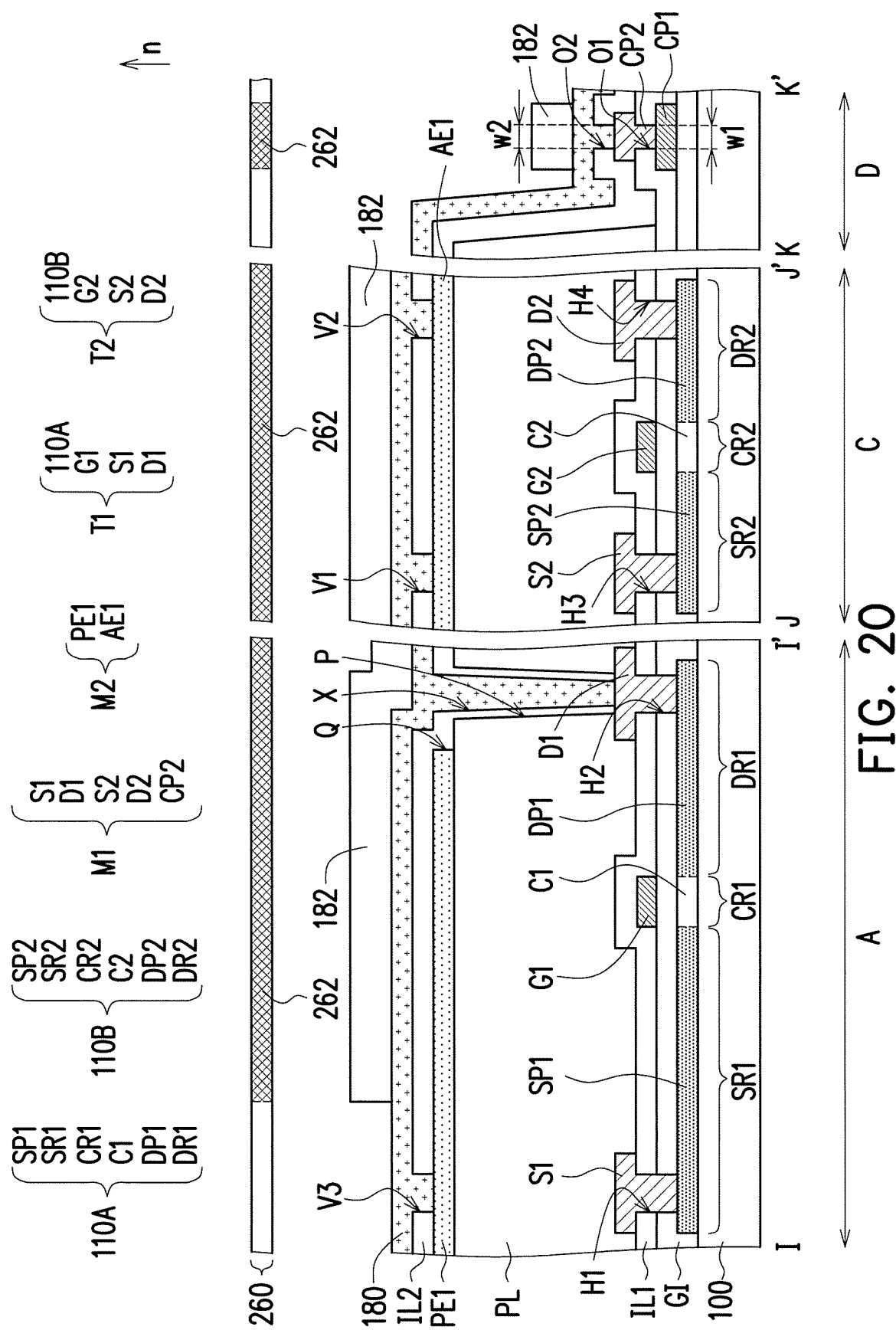
Figure 2P:
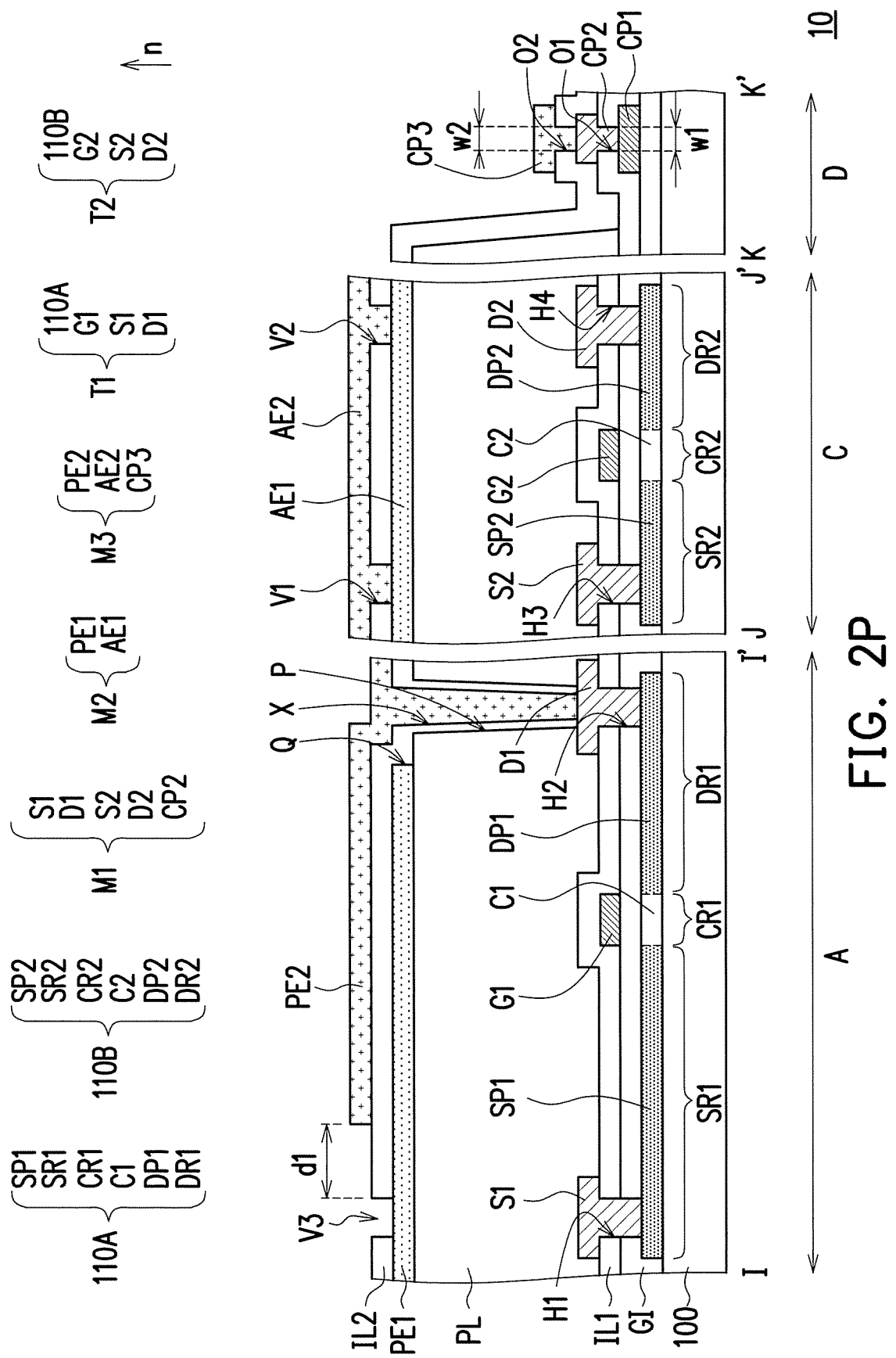
Figures 7A, 7B, 7C:
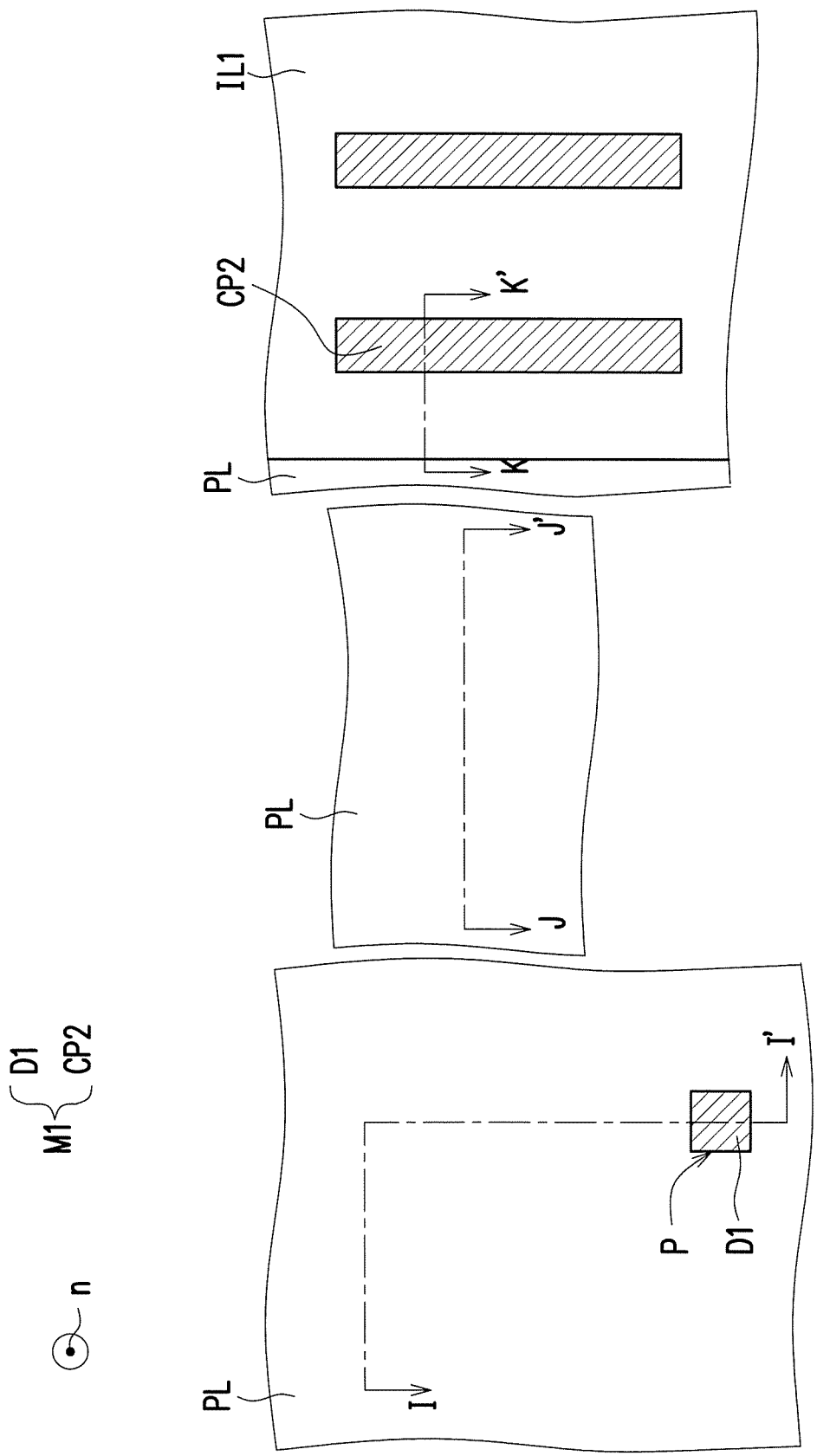
FIG. 7A, FIG. 7B and FIG. 7C are schematic top views of FIG. 2J, wherein cross-sectional positions of FIG. 2J respectively correspond to positions of a sectional line I-I' of FIG. 7A, a sectional line J-J' of FIG. 7B, and a sectional line K-K' of FIG. 7C.

FIG. 2A to FIG. 2P are schematic cross-sectional views of a process for fabricating a portion of an array substrate according to an embodiment of the invention. FIG. 3A, FIG. 3B and FIG. 3C are schematic top views of FIG. 2B. FIG. 4A, FIG. 4B and FIG. 4C are schematic top views of FIG. 2D. FIG. 5A, FIG. 5B and FIG. 5C are schematic top views of FIG. 2F. FIG. 6A, FIG. 6B and FIG. 6C are schematic top views of FIG. 2H. FIG. 7A, FIG. 7B and FIG. 7C are schematic top views of FIG. 2J. FIG. 8A, FIG. 8B and FIG. 8C are schematic top views of FIG. 2L. FIG. 9A, FIG. 9B and FIG. 9C are schematic top views of FIG. 2N. FIG. 10A, FIG. 10B and FIG. 10C are schematic top views of FIG. 2P. Note that cross-sectional positions of FIG. 2B, FIG. 2D, FIG. 2F, FIG. 2H, FIG. 2J, FIG. 2L, FIG. 2N and FIG. 2P respectively correspond to positions of sectional lines I-I' of FIG. 3A to FIG. 10A, sectional lines J-J' of FIG. 3B to FIG. 10B, and sectional lines K-K' of FIG. 3C to FIG. 10C.

Referring to FIG. 2A, a substrate 100 is first provided. The substrate 100 may be a rigid substrate, such as a glass substrate, a quartz substrate, or a silicon substrate or the substrate 100 may be a flexible substrate, such as a polymeric substrate or a plastic substrate. An active material layer 110 is then entirely formed on the substrate 100. In other words, in this embodiment, the active material layer 110 is located at the display region A, the driving circuit region C, and the bonding region D. The material of the active material layer 110 may include poly silicon. Besides, the method for forming the active material layer 110 may include physical vapor deposition (PVD) or chemical vapor deposition (CVD).

Next, a patterned photoresist layer 112 is formed on the active material layer 110. The method for forming the patterned photoresist layer 112 may include following steps: performing an exposure process and a development process to a photoresist material layer by using a photo mask 200 after forming the photoresist material layer (not shown) on the active material layer 110. In this embodiment, the photo mask 200 has non-transparent photo mask patterns 202. The patterned photoresist layer 112 is then taken as a mask to perform an etching process on the active material layer 110, so as to form a first active layer 110A located at the display region A and a second active layer 110B located at the driving circuit region C in FIG. 2B, FIG. 3A, and FIG. 3B. It thus can be seen that in this embodiment, the first active layer 110A and the second active layer 110B are formed through a first photolithography and etching process in which the photo mask 200 is used.

Next, referring to FIG. 2A, FIG. 2B, and FIG. 3A to FIG. 3C together, the patterned photoresist layer 112 and the photo mask 200 are removed after performing the etching process to form the first active layer 110A and the second active layer 110B. The method for removing the patterned photoresist layer 112 may include performing a wet photoresist etching process or a dry photoresist etching process. Referring to FIG. 2B, FIG. 3A, and FIG. 3B together, in this embodiment, the first active layer 110A has a first channel predetermined region CR1, a first source doped predetermined region SR1, and a first drain doped predetermined region DR1, and the second active layer 110B has a second channel predetermined region CR2, a second source doped predetermined region SR2, and a second drain doped predetermined region DR2. In this embodiment, the first source doped predetermined region SR1 and the first drain doped predetermined region DR1 are respectively located at two sides of the first channel predetermined region CR1, and the second source doped predetermined region SR2 and the second drain doped predetermined region DR2 are respectively located at two sides of the second channel predetermined region CR2.

Next, referring to FIG. 2C, a gate insulation layer GI covering the first active layer 110A and the second active layer 110B is entirely formed on the substrate 100. Namely, in this embodiment, the gate insulation layer GI is located at the display region A, the driving circuit region C, and the bonding region D. In this embodiment, the material of the gate insulation layer GI may include an inorganic material, an organic material, or a combination thereof. The inorganic material is, for example, silicon oxide, silicon nitride, silicon oxynitride, or a stacked layer having at least two of the aforementioned materials, but is not limited thereto. The organic material is, for example, a polyimide resin, an epoxy resin, an acrylate resin, or other polymer materials, but is not limited thereto. Although the gate insulation layer GI is a single layer in this embodiment, the invention is not limited thereto. In other embodiments, the gate insulation layer GI may be formed by a plurality of stacked film layers. In addition, in this embodiment, the gate insulation layer GI may be formed through physical vapor deposition or chemical vapor deposition.

After the gate insulation layer GI is formed, a conductor material layer 120 is entirely formed on the gate insulation layer GI. In other words, in this embodiment, the conductor material layer 120 is located at the display region A, the driving circuit region C, and the bonding region D. Based on consideration of electrical conductivity, the material of the conductor material layer 120 is generally a metal material including aluminum, molybdenum, titanium, gold, indium, tin, or a combination thereof, but not limited thereto. However, the invention is not limited thereto. In other embodiments, the material of the conductor material layer 120 may include other conductive materials (such as alloy, metal nitride, metal oxide, metal oxynitride), or a stacked layer having a metal material and the aforesaid other conductive materials, but not limited thereto. In addition, the conductor material layer 120 may be formed by chemical vapor deposition or physical vapor deposition.

A patterned photoresist layer 122 is then formed on the conductor material layer 120. The method for forming the patterned photoresist layer 122 may include following steps: performing an exposure process and a development process to a photoresist material layer by using a photo mask 210 after forming the photoresist material layer (not shown) on the conductor material layer 120. In this embodiment, the photo mask 210 has non-transparent photo mask patterns 212. The patterned photoresist layer 122 is then taken as a mask to perform an etching process on the conductor material layer 120, so as to form a first gate G1 overlapped with the first channel predetermined region CR1 along a normal direction n, a second gate G2 overlapped with the second channel predetermined region CR2 along the normal direction n, and a first conductor pattern CP1 located at the bonding region D in FIG. 2D, FIG. 4A to FIG. 4C. It thus can be seen that in this embodiment, the first gate G1, the second gate G2 and the first conductor pattern CP1 are formed through a second photolithography and etching process in which the photo mask 210 is used.

Next, referring to FIG. 2C, FIG. 2D, and FIG. 4A to 4C together, the patterned photoresist layer 122 and the photo mask 210 are removed after performing the etching process to form the first gate G1 and the second gate G2. The method for removing the patterned photoresist layer 122 may include performing a wet photoresist etching process or a dry photoresist etching process. Referring to FIG. 2D, FIG. 4A and FIG. 4B together, the first gate G1 and the second gate G2 are then taken as masks to perform an ion doping process on the first active layer 110A and the second active layer 110B, so as to form a source doped portion SP1 in the first source doped predetermined region SR1, to form a drain doped portion DP1 in the first drain doped predetermined region DR1, to form a channel C1 in the first channel predetermined region CR1, to form a source doped portion SP2 in the second source doped predetermined region SR2, to form a drain doped portion DP2 in the second drain doped predetermined region DR2, and to form a channel C2 in the second channel predetermined region CR2. In this embodiment, the ion doping process may be performed by any method commonly known to people having ordinary skills in the art.

In this embodiment, the first gate G1 and the second gate G2 are taken as the masks in the ion doping process, but the invention is not limited thereto. In other embodiments, the patterned photoresist layer 122, the first gate G1 and the second gate G2 may all be taken as the masks when performing the ion doping process. In addition, in this embodiment, although the source doped portion SP1, the source doped portion~SP2, the drain doped portion DP1, the drain doped portion DP2, and the channel C1 and the channel C2 are formed after the first gate G1 and the second gate G2 are formed, the invention is not limited thereto. In other embodiments, the ion doping process may also be performed after the first active layer 110A and the second active layer 110B are formed and before the gate insulation layer GI is formed. In addition, in this embodiment, although only the source doped portion SP1 and the drain doped portion DP1 are formed in the first active layer 110A, and only the source doped portion SP2 and the drain doped portion DP2 are formed in the second active layer 110B, the invention is not limited thereto. In other embodiments, a source lightly doped portion and a drain lightly doped portion may also be formed respectively in the first active layer 110A and the second active layer 110B, wherein the dopant of the source lightly doped portion and that of the drain lightly doped portion are of the identical kind, and the concentrations thereof are different from the concentrations of the dopants of the source doped portion SP1, the source doped portion SP2, the drain doped portion DP1 and the drain doped portion DP2.

Referring to FIG. 4A and FIG. 4B together, in this embodiment, when performing the second photolithography and etching process to form the first gate G1 and the second gate G2, the step further includes forming a scan line SL. In this embodiment, the first gate G1 and the scan line SL1 constitute a continuous conductive pattern.

Referring to FIG. 2E, a first interlayered insulation layer IL1 covering the first gate G1, the second gate G2 and the first conductor pattern CP1 is then entirely formed on the substrate 100. In other words, in this embodiment, the first interlayered insulation layer IL1 is located at the display region A, the driving circuit region C, and the bonding region D. In this embodiment, the material of the first interlayered insulation layer IL1 may include an inorganic material, an organic material, or a combination thereof. The inorganic material is, for example, silicon oxide, silicon nitride, silicon oxynitride, or a stacked layer having at least two of the aforementioned materials, but not limited thereto. The organic material is, for example, a polyimide resin, an epoxy resin, an acrylate resin, or other polymer materials, but not limited thereto. The first interlayered insulation layer IL1 is a single layer in this embodiment, but the invention is not limited thereto. In other embodiments, the first interlayered insulation layer IL1 may be formed by a plurality of stacked film layers. In addition, in this embodiment, the first interlayered insulation layer IL1 may be formed through physical vapor deposition or chemical vapor deposition.

A pattern photoresist layer 132 is then formed on the first interlayered insulation layer IL1. The method for forming the patterned photoresist layer 132 may include following steps: performing an exposure process and a development process to a photoresist material layer by using a photo mask 220 after forming the photoresist material layer (not shown) on the first interlayered insulation layer IL1. In this embodiment, the photo mask 220 has non-transparent photo mask patterns 222. The patterned photoresist layer 132 is then taken as a mask to perform an etching process, so as to form a first contact hole H1, a second contact hole H2, a third contact hole H3 and a fourth contact hole H4 located in the first interlayered insulation layer IL1 and the gate insulation layer GI, and at least one first bonding region opening O1 located in the first interlayered insulation layer IL1 as shown in FIG. 2F and FIG. 5A to FIG. 5C. It thus can be seen that in this embodiment, the first contact hole H1, the second contact hole H2, the third contact hole H3, the fourth contact hole H4 and the at least one first bonding region opening O1 are formed by a third photolithography and etching process in which the photo mask 220 is used.

Next, referring to FIG. 2E, FIG. 2F, and FIG. 5A to 5C together, the patterned photoresist layer 132 and the photo mask 220 are removed after performing the etching process to form the first contact hole H1, the second contact hole H2, the third contact hole H3, the fourth contact hole H4 and the at least one first bonding region opening O1. The method for removing the patterned photoresist layer 132 may include performing a wet photoresist etching process or a dry photoresist etching process. Referring to FIG. 2F and FIG. 5A to FIG. 5C together, in this embodiment, the first contact hole H1 exposes at least a portion of the source doped portion SP1, the second contact hole H2 exposes at least a portion of the drain doped potion DP1, the third contact hole H3 exposes at least a portion of the source doped potion SP2, the fourth contact hole H4 exposes at least a portion of the drain doped potion DP2, and the at least one first bonding region opening O1 and the first conductor pattern CP1 are overlapped along the normal direction n. Besides, in this embodiment, a maximum width of each of the first contact hole H1, the second contact hole H2, the third contact hole H3 and the fourth contact hole H4 is less than or equal to 7 microns. For instance, in an embodiment, when the material of the first interlayered insulation layer IL1 and the gate insulation layer GI is silicon oxide, silicon nitride, silicon oxynitride, or a stacked layer having at least two of the aforementioned materials, the maximum width of each of the first contact hole H1, the second contact hole H2, the third contact hole H3 and the fourth contact hole H4 is approximately 3 microns.

Referring to FIG. 2G, a first conductor material layer 140 is then entirely formed on the substrate 100. In other words, in this embodiment, the first conductor material layer 140 is located at the display region A, the driving circuit region C and the bonding region D. Besides, in this embodiment, the first conductor material layer 140 may further fill the first contact hole H1, the second contact hole H2, the third contact hole H3, the fourth contact hole H4 and the at least one first bonding region opening O1 and thus is in contact with the source doped portion SP1, the source doped portion SP2, the drain doped portion DP1, the drain doped portion DP2 and the first conductor pattern CP1.

Based on consideration of electrical conductivity, the material of the first conductor material layer 140 is generally a metal material including aluminum, molybdenum, titanium, gold, indium, tin, or a combination thereof, but not limited thereto. However, the invention is not limited thereto. In other embodiments, the material of the first conductor material layer 140 may include, for example, other conductive materials (such as alloy, metal nitride, metal oxide, metal oxynitride), or a stacked layer having a metal material and the aforesaid other conductive materials, but not limited thereto. In addition, the first conductor material layer 140 may be formed by chemical vapor deposition or physical vapor deposition.

A patterned photoresist layer 142 is then formed on the first conductor material layer 140. The method for forming the patterned photoresist layer 142 may include following steps: performing an exposure process and a development process to a photoresist material layer by using a photo mask 230 after forming the photoresist material layer (not shown) on the first conductor material layer 140. In this embodiment, the photo mask 230 has non-transparent photo mask patterns 232. The patterned photoresist layer 142 is then taken as a mask to perform an etching process on the first conductor material layer 140, so as to form a first conductor layer M1 in FIG. 2H and FIG. 6A to FIG. 6C, wherein the first conductor layer M1 includes a first source S1, a first drain D1, a second source S2, a second drain D2 and a second conductor pattern CP2. It thus can be seen that in this embodiment, the first conductor layer M1 is formed through a fourth photolithography and etching process in which the photo mask 230 is used.

Next, referring to FIG. 2G, FIG. 2H, and FIG. 6A to 6C together, the patterned photoresist layer 142 and the photo mask 230 are removed after performing the etching process to form the first source S1, the first drain D1, the second source S2, the second drain D2 and the second conductor pattern CP2. The method for removing the patterned photoresist layer 142 may include performing a wet photoresist etching process or a dry photoresist etching process. Referring to FIG. 2H, in this embodiment, the first source S1, the first drain D1, the second source S2 and the second drain D2 are in contact with the source doped portion SP1 formed in the first source doped predetermined region SR1, the drain doped portion DP1 formed in the first drain doped predetermined region DR1, the source doped portion SP2 formed in the second source doped predetermined region SR2, and the drain doped portion DP2 formed in the second drain doped predetermined region DR2 respectively through the first contact hole H1, the second contact hole H2, the third contact hole H3, and the fourth contact hole H4, and the second conductor pattern CP2 is in contact with the first conductor pattern CP1 through the at least one first bonding region opening O1. In other words, in this embodiment, the first source S1, the first drain D1, the second source S2 and the second drain D2 are electrically connected to the source doped portion SP1, the drain doped portion DP1, the source doped portion SP2 and the drain doped portion DP2 respectively through the first contact hole H1, the second contact hole H2, the third contact hole H3, and the fourth contact hole H4. The second conductor pattern CP2 is electrically connected to the first conductor pattern CP1 through the at least one first bonding region opening O1.

Referring to FIG. 6A to FIG. 6C together, it is worth mentioning that in this embodiment, the first conductor layer M1 further includes a data line DL. In this embodiment, the first source S1 and the data line DL constitute a continuous conductive pattern.

The fabrication of an active element T1 and a driving element T2 is hereby completed on the substrate 110, wherein the active element T1 is located at the display region A, and the driving element T2 is located at the driving circuit region C. Referring to FIG. 2H, the active element T1 includes the first active layer 110A, the first gate G1, the first source S1 and the first drain D1, wherein the first active layer 110A has the source doped portion SP1 formed in the first source doped predetermined region SR1, the drain doped portion DP1 formed in the first drain doped predetermined region DR1, and the channel C1 formed in the first channel predetermined region CR1; the driving element T2 includes the second active layer 110B, the second gate G2, the second source S2 and the second drain D2, wherein the second active layer 110B has the source doped portion SP2 formed in the second source doped predetermined region SR2, the drain doped portion DP2 formed in the second drain doped predetermined region DR2, and the channel C2 formed in the second channel predetermined region CR2.

In this embodiment, each of the active element T1 and the driving element T2 has a top-gate thin film transistor structure. In addition, as described above, the material of the first active layer 110A and the second active layer 110B may include polysilicon, such that the active element T1 and the driving element T2 may be low-temperature polysilicon thin film transistors (LTPS-TFTs).

As shown in FIG. 2I, a planarization layer PL covering the first conductor layer M1 is then entirely formed on the substrate 100 to provide the function of protecting the active element T1 and the driving element T2 or provide the function of planarization. In this embodiment, the material of the planarization layer PL may include an inorganic material, an organic material, or a combination thereof. The inorganic material is, for example, silicon oxide, silicon nitride, silicon oxynitride, or a stacked layer having at least two of the aforementioned materials, but not limited thereto. The organic material is, for example, a polyimide resin, an epoxy resin, an acrylate resin, or other polymer materials, but not limited thereto. Although the planarization layer PL is a single layer in this embodiment, the invention is not limited thereto. In other embodiments, the planarization layer PL may also be formed by a plurality of stacked film layers. In addition, in this embodiment, the planarization layer PL may be formed through physical vapor deposition, chemical vapor deposition, or photoresist coating.

A patterned photoresist layer 152 is then formed on the planarization layer PL. The method for forming the patterned photoresist layer 152 may include following steps: performing an exposure process and a development process to a photoresist material layer by using a photo mask 240 after forming the photoresist material layer (not shown) on the planarization layer PL. In this embodiment, the photo mask 240 has non-transparent photo mask patterns 242. The patterned photoresist layer 152 is then taken as a mask to perform an etching process on the planarization layer PL, so as to form a display region opening P located in the planarization layer PL as shown in FIG. 2J, FIG. 7A and FIG. 7C, and to remove a portion of the planarization layer PL located at the bonding region D to expose the second conductor pattern CP2. It thus can be seen that in this embodiment, forming the display region opening P and removing the portion of the planarization layer PL located at the bonding region D are performed through a fifth photolithography and etching process in which the photo mask 240 is used.

Next, referring to FIG. 2I, FIG. 2J, and FIG. 7A to 7C together, the patterned photoresist layer 152 and the photo mask 240 are removed after performing the etching process to form the display region opening P and remove the portion of the planarization layer PL located at the bonding region D. The method for removing the patterned photoresist layer 152 may include performing a wet photoresist etching process or a dry photoresist etching process. Furthermore, referring to FIG. 2J and FIG. 7A together, in this embodiment, the display region opening P exposes at least a portion of the first drain D1.

Referring to FIG. 2K, a second conductor material layer 160 is entirely formed on the substrate 100. In other words, in this embodiment, the second conductor material layer 160 is located at the display region A, the driving circuit region C, and the bonding region D. On the other hand, in this embodiment, the second conductor material layer 160 covers the planarization layer PL and the second conductor pattern CP2 and fills the display region opening P and thus is in contact with the first drain D1. In this embodiment, the material of the second conductor material layer 160 may include a transparent metal oxide conductive material, such as indium tin oxide, indium zinc oxide, aluminum tin oxide, aluminum zinc oxide, or indium germanium zinc oxide, but not limited thereto. In addition, the second conductor material layer 160 may be formed by chemical vapor deposition or physical vapor deposition.

A patterned photoresist layer 162 is then formed on the second conductor material layer 160. The method for forming the patterned photoresist layer 162 may include following steps: performing an exposure process and a development process to a photoresist material layer by using a photo mask 250 after forming the photoresist material layer (not shown) on the second conductor material layer 160. In this embodiment, the photo mask 250 has non-transparent photo mask patterns 252. The photoresist layer 162 is then taken as a mask to perform an etching process on the second conductor material layer 160, so as to form a second conductor layer M2 as shown in FIG. 2L and FIG. 8A and FIG. 8B, wherein the second conductor layer M2 includes a first pixel electrode PE1 located at the display region A and a first auxiliary electrode AE1 located at the driving circuit region C, and the first pixel electrode PE1 has an opening Q. It thus can be seen that in this embodiment, the second conductor layer M2 is formed through a sixth photolithography and etching process in which the photo mask 250 is used.

Next, referring to FIG. 2K, FIG. 2L, and FIG. 8A to 8C together, the patterned photoresist layer 162 and the photo mask 250 are removed after performing the etching process to form the second conductor layer M2. The method for removing the patterned photoresist layer 162 may include performing a wet photoresist etching process or a dry photoresist etching process. Furthermore, referring to FIG. 2L and FIG. 8A together, in this embodiment, the opening Q may expose a portion of the planarization layer PL, the display region opening P, and a portion of the first drain D1.

Next, referring to FIG. 2M, a second interlayered insulation layer IL2 covering the second conductor layer M2 and the second conductor pattern CP2 is entirely formed on the substrate 100. In this embodiment, the second interlayered insulation layer IL2 is located at the display region A, the driving circuit region C and the bonding region D. In this embodiment, the material of the second interlayered insulation layer IL2 may include an inorganic material, an organic material, or a combination thereof. The inorganic material is, for example, silicon oxide, silicon nitride, silicon oxynitride, or a stacked layer having at least two of the aforementioned materials, but not limited thereto. The organic material is, for example, a polyimide resin, an epoxy resin, an acrylate resin, or other polymer materials, but not limited thereto. The second interlayered insulation layer IL2 is a single layer in this embodiment, but the invention is not limited thereto. In other embodiments, the second interlayered insulation layer IL2 may be formed by a plurality of stacked film layers. In addition, in this embodiment, the second interlayered insulation layer IL2 may be formed through physical vapor deposition or chemical vapor deposition.

In FIG. 2M, a pattern photoresist layer 172 is then formed on the second interlayered insulation layer IL2. The method for forming the patterned photoresist layer 172 may include following steps: performing an exposure process and a development process to a photoresist material layer by using the photo mask 220 used in aforesaid third photolithography and etching process after forming the photoresist material layer (not shown) on the second interlayered insulation layer IL2. The patterned photoresist layer 172 is then taken as a mask to perform an etching process on the second interlayered insulation layer IL2, so as to form a first opening V1, a second opening V2, a third opening V3, a via hole X, and at least one second bonding region opening O2 located in the second interlayered insulation layer IL2 in FIG. 2N and FIG. 9A to FIG. 9C. It thus can be seen that in this embodiment, the first opening V1, the second opening V2, the third opening V3, the via hole X, and the at least one second bonding region opening O2 are formed by a seventh photolithography and etching process in which the photo mask 220 is used.

Note that in this embodiment, as described above, the same photo mask 220 is used in the third photolithography and etching process and the seventh photolithography and etching process, such that only six photo masks (i.e., the photo mask 200, the photo mask 210, the photo mask 220, the photo mask 230, the photo mask 240, and the photo mask 250) are required to be used when performing seven photolithography and etching processes. Therefore, in the method for fabricating the array substrate 10, the number of the photo masks used is saved and fabricating costs are lowered.

Next, referring to FIG. 2M, FIG. 2N, and FIG. 9A to 9C together, the patterned photoresist layer 172 and the photo mask 220 are removed after performing the etching process to form the first opening V1, the second opening V2, the third opening V3, the via hole X, and the at least one second bonding region opening O2. The method for removing the patterned photoresist layer 172 may include performing a wet photoresist etching process or a dry photoresist etching process.

Referring to FIG. 2N and FIG. 9A to FIG. 9C, in this embodiment, the first opening V1 and the third contact hole H3 are overlapped along the normal direction n, the second opening V2 and the fourth contact hole H4 are overlapped along the normal direction n, the third opening V3 and the first contact hole H1 are overlapped along the normal direction n, the via hole X and the second contact hole H2 are overlapped along the normal direction n, and the at least one second bonding region opening O2 and the at least one first bonding region opening O1 are overlapped along the normal direction n. In this embodiment, the first opening V1 and the second source S2 are overlapped along the normal direction n, the second opening V2 and the second drain D2 are overlapped along the normal direction n, the third opening V3 and the first source S1 are overlapped along the normal direction n, the via hole X exposes at least one portion of the first drain D1, and the at least one second bonding region opening O2 and the second conductor pattern CP2 are overlapped along the normal direction n. In this embodiment, the first opening V1 and the first auxiliary electrode AE1 are overlapped along the normal direction n, the second opening V2 and the first auxiliary electrode AE1 are overlapped along the normal direction n, and the third opening V3 and the first pixel electrode PE1 are overlapped along the normal direction n.

In this embodiment, as the first auxiliary electrode AE1 is designed to be overlapped with the first opening V1 and the second opening V2 along the normal direction n, the planarization layer PL located below the first auxiliary electrode AE1 is thereby prevented from being exposed to the atmospheric environment in which deterioration problem may occur resulted from moisture absorption.

In this embodiment, the maximum width of each of the first opening V1, the second opening V2 and the third opening V3 is less than or equal to 7 microns. For instance, in an embodiment, when the material of the second interlayered insulation layer IL2 is silicon oxide, silicon nitride, silicon oxynitride, or a stacked layer having at least two of the aforementioned materials, the maximum width of each of the first opening V1, the second opening V2 and the third opening V3 is approximately 3 microns.

In addition, in this embodiment, the maximum width of each of the first contact hole H1, the second contact hole H2, the third contact hole H3 and the fourth contact hole H4 is approximately 50% to 150% of the maximum width of each of the first opening V1, the second opening V2, the third opening V3 and the via hole X, but the invention is not limited thereto. In other embodiments, the maximum width of at least one of the first contact hole H1, the second contact hole H2, the third contact hole H3 and the fourth contact hole H4 is approximately 50% to 150% of the maximum width of at least one of the first contact hole H1, the second contact hole H2, the third contact hole and the via hole X. In this embodiment, as shown in FIG. 2N, the maximum width of each of the third opening V3, the via hole X, the first opening V1 and the second opening V2 is respectively equal to the maximum width of each of the first contact, hole H1, the second contact hole H2, the third contact hole H3 and the fourth contact hole H4, but the invention is not limited thereto. In other embodiments, the maximum widths of the third opening V3, the via hole X, the first opening V1 and the second opening V2 may also respectively be different from that of the first contact hole H1, the second contact hole H2, the third contact hole H3 and the fourth contact hole H4.

In this embodiment, as shown in FIG. 2N, the maximum width w2 of the at least one second bonding region opening O2 is equal to the maximum width w1 of the at least one first bonding region opening O1. Nevertheless, the invention is not limited thereto. In other embodiments, the maximum width w2 of the at least one second bonding region opening O2 may also be different from the maximum width w1 of the at least one first bonding region opening O1.

In addition, referring to FIG. 9C and FIG. 5C together, in this embodiment, the number of the at least one first bonding region opening O1 is equal to the number of the at least one second bonding region opening O2.

Referring to FIG. 2O, a third conductor material layer 180 is then entirely formed on the substrate 100. In other words, in this embodiment, the third conductor material layer 180 is located at the display region A, the driving circuit region C, and the bonding region D. Besides, in this embodiment, the third conductor material layer 180 fills the first opening V1, the second opening V2, the third opening V3, the via hole X, and the at least one second bonding opening O2 and thus is in contact with the first auxiliary electrode AE1, the first pixel electrode PE1, the first drain D1 and the second conductor pattern CP2. In this embodiment, the material of the third conductor material layer 180 may include a transparent metal oxide conductive material, such as indium tin oxide, indium zinc oxide, aluminum tin oxide, aluminum zinc oxide, or indium germanium zinc oxide, but not limited thereto. In addition, the third conductor material layer 180 may be formed by chemical vapor deposition or physical vapor deposition.

A patterned photoresist layer 182 is then formed on the third conductor material layer 180. The method for forming the patterned photoresist layer 182 may include following steps: performing an exposure process and a development process to a photoresist material layer by using a photo mask 260 after forming the photoresist material layer (not shown) on the third conductor material layer 180. In this embodiment, the photo mask 260 has non-transparent photo mask patterns 262. The patterned photoresist layer 182 is then taken as a mask to perform an etching process on the third conductor material layer 180, so as to form a third conductor layer M3 in FIG. 2P and FIG. 10A to FIG. 10C, wherein the third conductor layer M3 includes a second pixel electrode PE2 located at the display region A, a second auxiliary electrode AE2 located at the driving circuit region C, and a third conductor pattern CP3 located at the bonding region D. It thus can be seen that in this embodiment, the third conductor layer M3 is formed through an eighth photolithography and etching process in which the photo mask 260 is used.

Next, referring to FIG. 2O, FIG. 2P, and FIG. 10A to 10C together, the patterned photoresist layer 182 and the photo mask 260 are removed after performing the etching process to form the third conductor layer M3. The method for removing the patterned photoresist layer 182 may include performing a wet photoresist etching process or a dry photoresist etching process. Referring to FIG. 2P, in this embodiment, the second pixel electrode PE2 is in contact with the first drain D1 of the active element T1 through the via hole X, the second auxiliary electrode AE2 is in contact with the first auxiliary electrode AE1 through the first opening V1 and the second opening V2, and the third conductor pattern CP3 is in contact with the second conductor pattern CP2 through the at least one second bonding region opening O2. In other words, in this embodiment, the second pixel electrode PE2 is electrically connected to the first drain D1 of the active element T1 through the via hole X, the second auxiliary electrode AE2 is electrically connected to the first auxiliary electrode AE1 through the first opening V1 and the second opening V2, and the third conductor pattern CP3 is electrically connected to the second conductor pattern CP2 through the at least one second bonding region opening O2.

In this embodiment, a pixel voltage is transmitted to the second pixel electrode PE2 through the active element T1. The first pixel electrode PE1, the first auxiliary electrode AE1 and the second auxiliary electrode AE2 may be all electrically connected to a common voltage. In this embodiment, when the second auxiliary electrode AE2 is electrically connected to the first auxiliary electrode AE1 through the first opening V1 and the second opening V2, parallel connection effect may be achieved thereby a resistance is lowered and the common voltage may be transmitted more uniformly.

In this embodiment, the third conductor pattern CP3 is electrically connected to an external circuit. The external circuit is, for example, a driving chip, a control circuit, a flexible printed circuit (FPC), or a printed circuit board (PCB) with a driving chip. In this embodiment, as the maximum width w1 of the at least one first bonding region opening O1 is greater than a maximum width of a corresponding opening in a conventional array substrate, a conductor structure formed by the first conductor pattern CP1, the second conductor pattern CP2 and the third conductor pattern CP3 is thus equipped with an appropriate resistance adapted for transmitting an external signal.

In addition, in this embodiment, the minimum horizontal distance d1 between the edge of the second pixel electrode PE2 and the third opening V3 satisfies the following relationship: 1 micron≤d1≤8 microns. As such, the second pixel electrode PE2 cannot be in contact with the first pixel electrode PE1 and a short can be prevented.

The fabrication of the array substrate 10 is thereby completed. As described above, the active element T1 and the driving element T2 of the array substrate 10 may be an LTPS-TFT, and thus, the array substrate 10 may be an LTPS array substrate. On the other hand, the array substrate 10 may adopt technology such as advanced hyper-viewing angle (AHVA) or fringe field switching (FFS). In the method for fabricating the array substrate 10, as the same photo mask 220 is used to form the first contact hole H1, the second contact hole H2, the third contact hole H3, the fourth contact hole H4 and the at least one first bonding region opening O1 (i.e., the third photolithography and etching process) and to form the first to the first opening V1, the second opening V2, the third opening V3, the via hole X and the at least one second bonding region opening O2 (i.e., the seventh photolithography and etching process), only seven photo masks (i.e., the photo mask 200, the photo mask 210, the photo mask 220, the photo mask 230, the photo mask 240, the photo mask 250 and the photo mask 260) are thus required when performing eight photolithography and etching processes. Therefore, in the method for fabricating the array substrate 10, the number of the photo masks used is saved and fabricating costs are lowered.

In addition, in the foregoing embodiments, although only one active element T1 and one driving element T2 are respectively illustrated in the display region A and the driving circuit region C, people having ordinary skills in the art should be able to understand that a plurality of active elements arranged in array are generally included in the display region of the array substrate, and a plurality of driving elements electrically connected to each other are generally included in the driving circuit region.

Besides, in the display region A of the foregoing embodiments, the first active layer 110A is directly disposed on the substrate 100, but the invention is not limited thereto. In other embodiments, a shielding layer located between the substrate 100 and the first active layer 110A may be disposed in the display region A.

The following descriptions will be provided in regard to other embodiments as shown in FIG. 11A to FIG. 11D, FIG. 12A, FIG. 12B, FIG. 12C, FIG. 13A, FIG. 13B, FIG. 13C and FIG. 14. It should be noted that the reference numerals and some descriptions provided in the previous embodiments are applicable in the following embodiments, in which identical or similar reference numerals indicate identical or similar elements, and repeated descriptions of the same technical contents are omitted. Please refer to the descriptions provided in the previous embodiments for the omitted contents, which will not be repeated hereinafter.

Figures 13A, 13B, 13C:
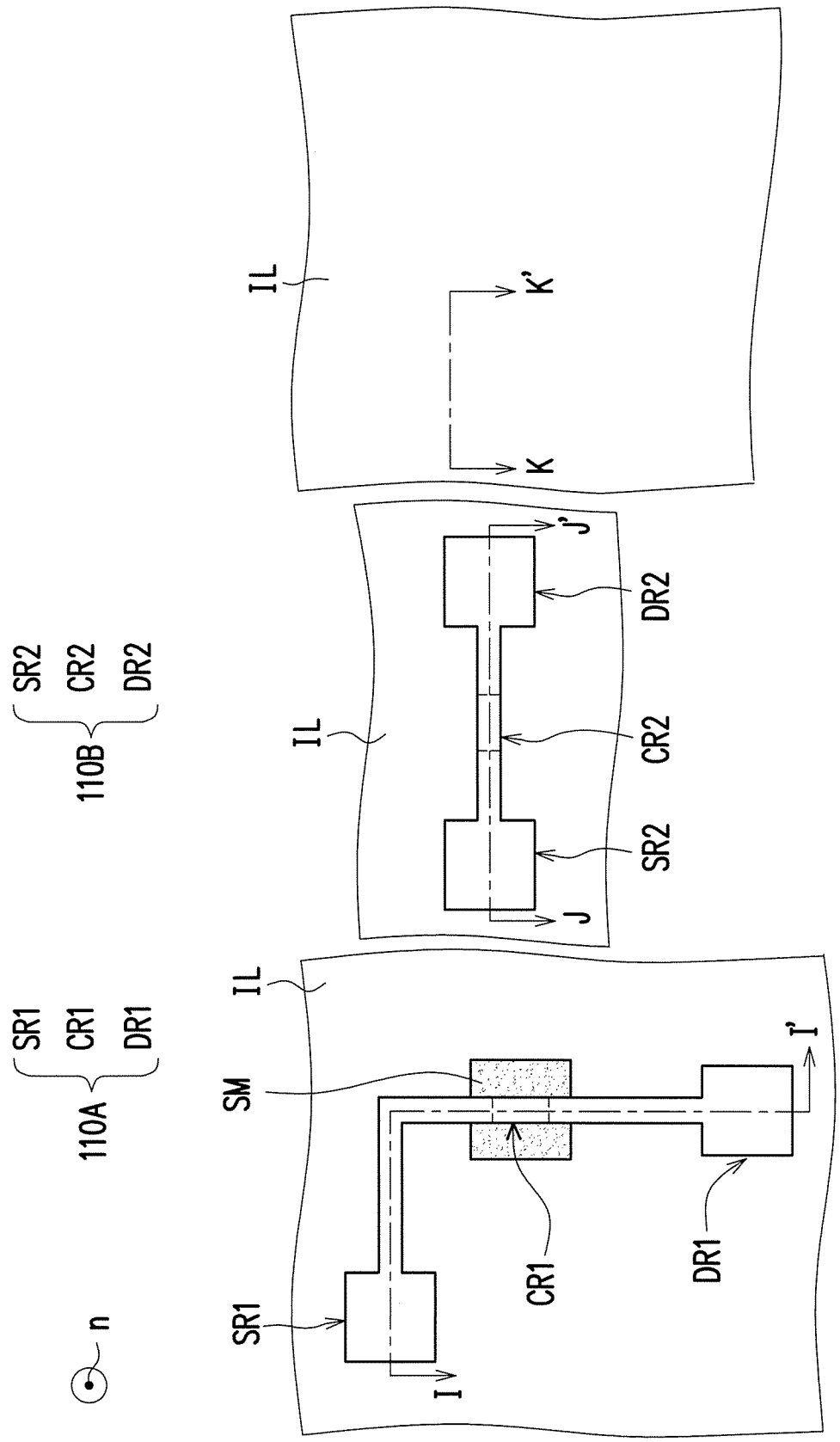
FIG. 13A, FIG. 13B and FIG. 13C are schematic top views of FIG. 11D, wherein cross-sectional positions of FIG. 11D respectively correspond to positions of a sectional line I-I' of FIG. 13A, a sectional line J-J' of FIG. 13B, and a sectional line K-K' of FIG. 13C.

FIG. 11A to FIG. 11D are schematic cross-sectional views of part of a process for fabricating a portion of an array substrate according to another embodiment of the invention. FIG. 12A, FIG. 12B and FIG. 12C are schematic top views of FIG. 11B. FIG. 13A, FIG. 13B and FIG. 13C are schematic top views of FIG. 11D. Cross-sectional positions of FIG. 11B and FIG. 11D respectively correspond to a sectional line I-I' of FIG. 12A to FIG. 13A, a sectional line J-J' of FIG. 12B to FIG. 13B, and a sectional line K-K' of FIG. 12C to FIG. 13C.

Figure 11A:
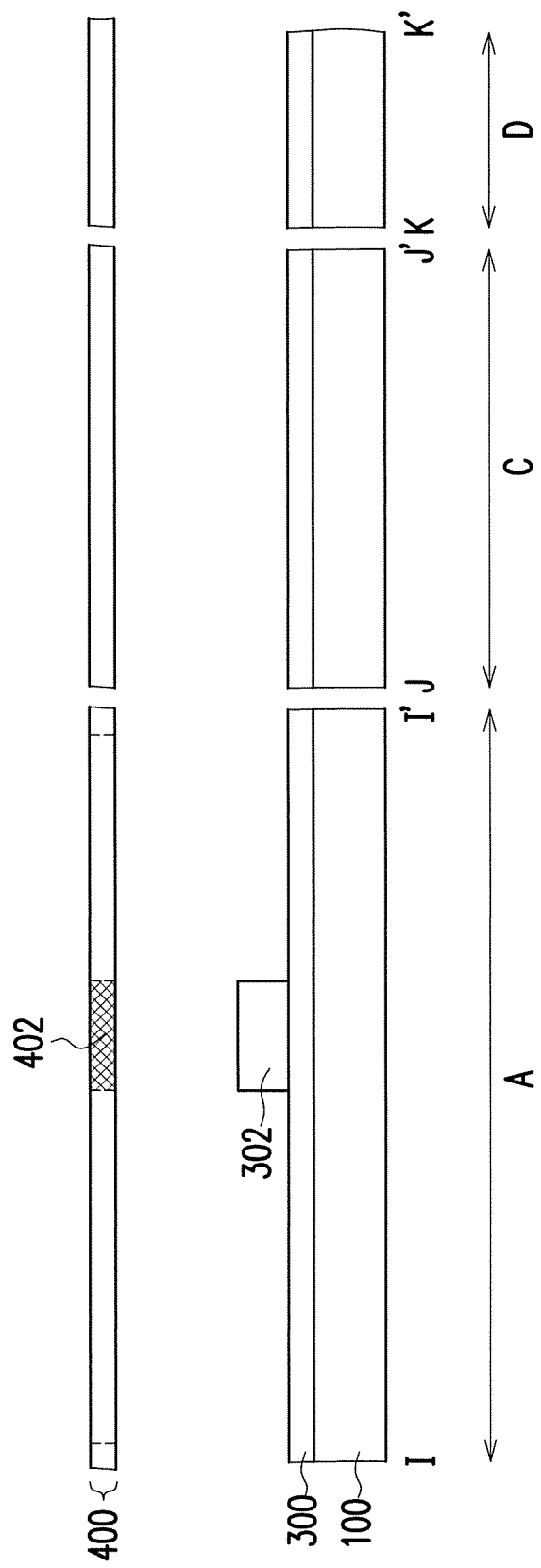
FIG. 11A to FIG. 11D are schematic cross-sectional views of part of a process for fabricating a portion of an array substrate according to another embodiment of the invention.
Figure 11B:
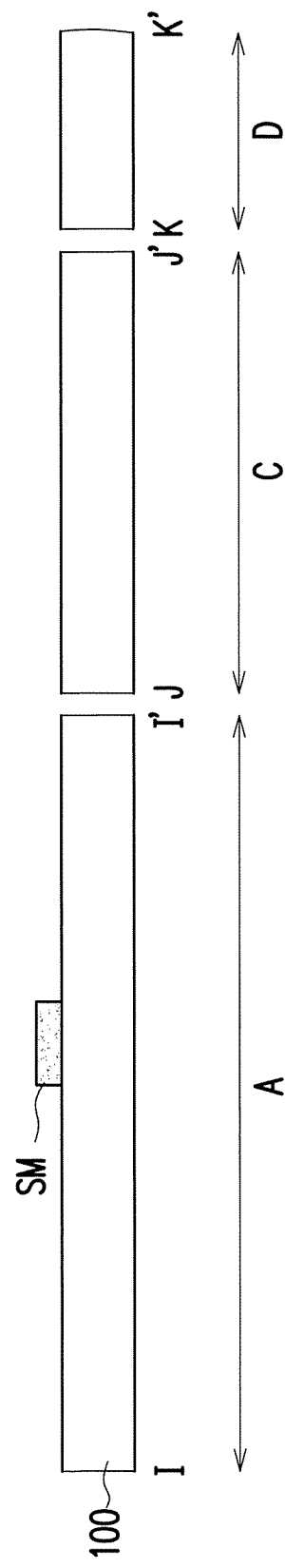

Referring to FIG. 11A first, a shielding material layer 300 is entirely formed on the substrate 100. In other words, in this embodiment, the shielding material layer 300 is located at the display region A, the driving circuit region C, and the bonding region D. The material of the shielding material layer 300 may include any light shielding material commonly known to people having ordinary skills in the art, e.g., molybdenum, molybdenum-aluminum-molybdenum, titanium-aluminum-titanium, or other metals which do not allow light to pass therethrough. In addition, the shielding material layer 300 may be formed by chemical vapor deposition or physical vapor deposition. In addition, relevant description of the substrate 100 is provided above in details and thus will not be further elaborated.

A patterned photoresist layer 302 is then formed on the shielding material layer 300. The method for forming the patterned photoresist layer 302 may include following steps: performing an exposure process and a development process to a photoresist material layer by using a photo mask 400 after forming the photoresist material layer (not shown) on the shielding material layer 300. In this embodiment, the photo mask 400 has non-transparent photo mask patterns 402. The patterned photoresist layer 302 is then taken as a mask to perform an etching process on the shielding material layer 300, so as to form a shielding layer SM located at the display region A in FIG. 11B and FIG. 12A. It thus can be seen that in this embodiment, the shielding material layer SM is formed through a first photolithography and etching process in which the photo mask 400 is used. Next, referring to FIG. 11A, FIG. 11B, and FIG. 12A to 12C together, the patterned photoresist layer 302 and the photo mask 400 are removed after performing the etching process to form the shielding layer SM. The method for removing the patterned photoresist layer 302 may include performing a wet photoresist etching process or a dry photoresist etching process.

Figure 11C:
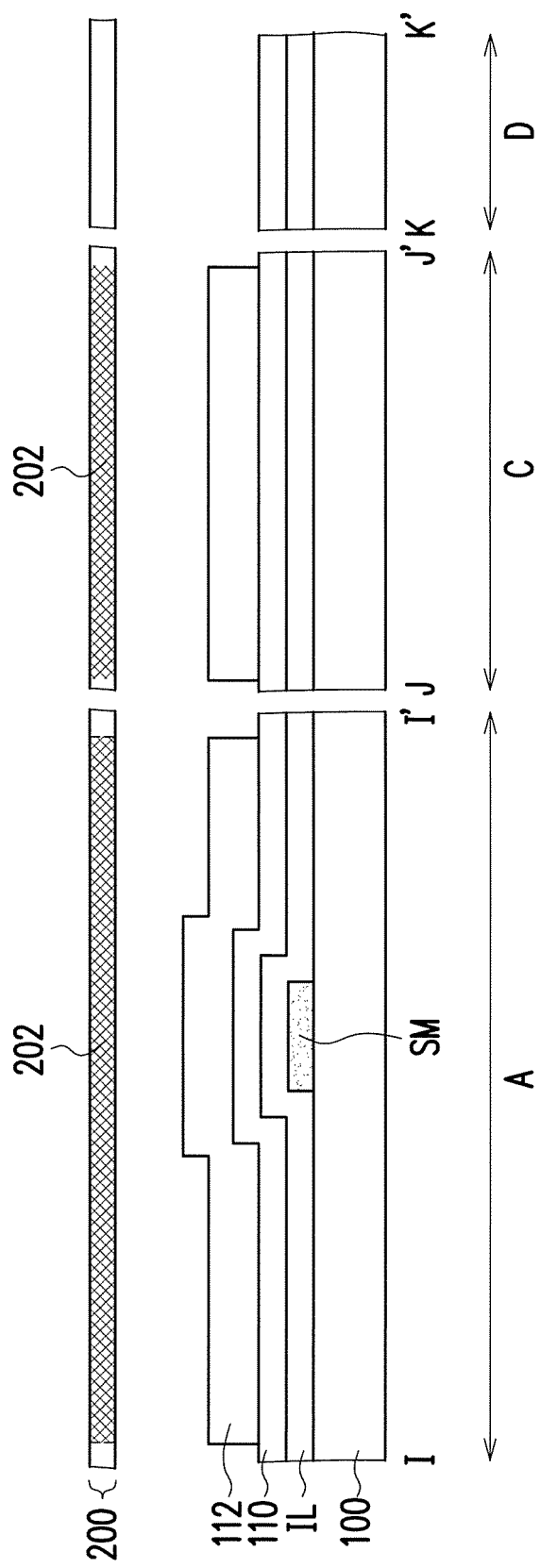

Referring to FIG. 11C, an insulation layer IL covering the shielding layer SM is then entirely formed on the substrate 100. In other words, in this embodiment, the insulation layer IL is located at the display region A, the driving circuit region C and the bonding region D. In this embodiment, the material of the insulation layer IL may include an inorganic material, an organic material, or a combination thereof. The inorganic material is, for example, silicon oxide, silicon nitride, silicon oxynitride, or a stacked layer having at least two of the aforementioned materials, but not limited thereto. The organic material is, for example, a polyimide resin, an epoxy resin, an acrylate resin, or other polymer materials, but not limited thereto. Although the insulation layer IL is a single layer in this embodiment, the invention is not limited thereto. In other embodiments, the insulation layer IL may also be formed by a plurality of stacked film layers. In addition, in this embodiment, the insulation layer IL may be formed through physical vapor deposition or chemical vapor deposition.

After the insulation layer IL is formed, an active material layer 110 is entirely formed on the insulation layer IL. Relevant description of the active material layer 110 is provided above in details and thus descriptions of repeated technical contents will be omitted. In this embodiment, the active material layer 110 covers the insulation layer IL and the shielding layer SM.

A patterned photoresist layer 112 is then formed on the active material layer 110 through using the photo mask 200 as shown in FIG. 11C. The method for forming the patterned photoresist layer 112 is provided above in details and thus descriptions of repeated technical contents will be omitted. The patterned photoresist layer 112 is then taken as a mask to perform an etching process on the active material layer 110, so as to form the first active layer 110A located at the display region A and the second active layer 110B located at the driving circuit region C in FIG. 11D, FIG. 13A, and FIG. 13B. It thus can be seen that in this embodiment, the first active layer 110A and the second active layer 110B are formed through a second photolithography and etching process in which the photo mask 200 is used.

Next, referring to FIG. 11C, FIG. 11D, and FIG. 13A to FIG. 13C together, the patterned photoresist layer 112 and the photo mask 200 are removed after performing the etching process to form the first active layer 110A and the second active layer 110B. The method for removing the patterned photoresist layer 112 is provided above in details and thus descriptions of repeated technical contents will be omitted. In addition, relevant description of the first active layer 110A and the second active layer 110B is provided above in details and thus descriptions of repeated technical contents will be omitted. In this embodiment, the first channel predetermined region CR1 of the first active layer 110A is overlapped with the shielding layer SM along the normal direction n. An orthogonal projection of the first channel predetermined region CR1 of the first active layer 110A may be entirely located within that of the shielding layer SM.

Figure 11D:
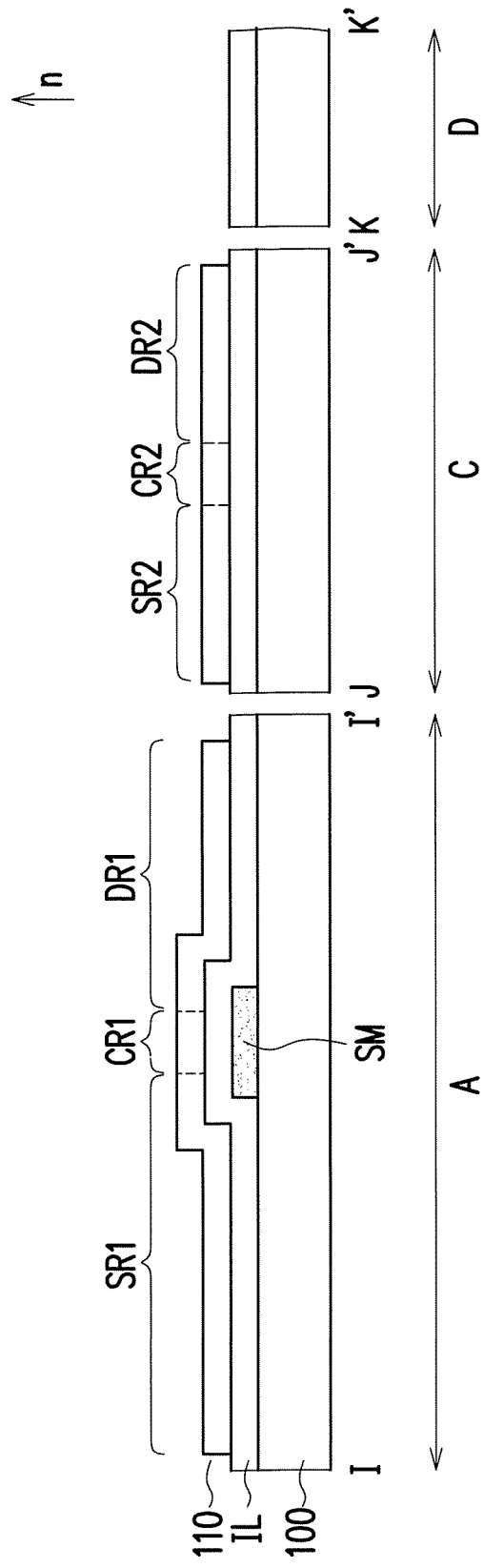
Figure 14:
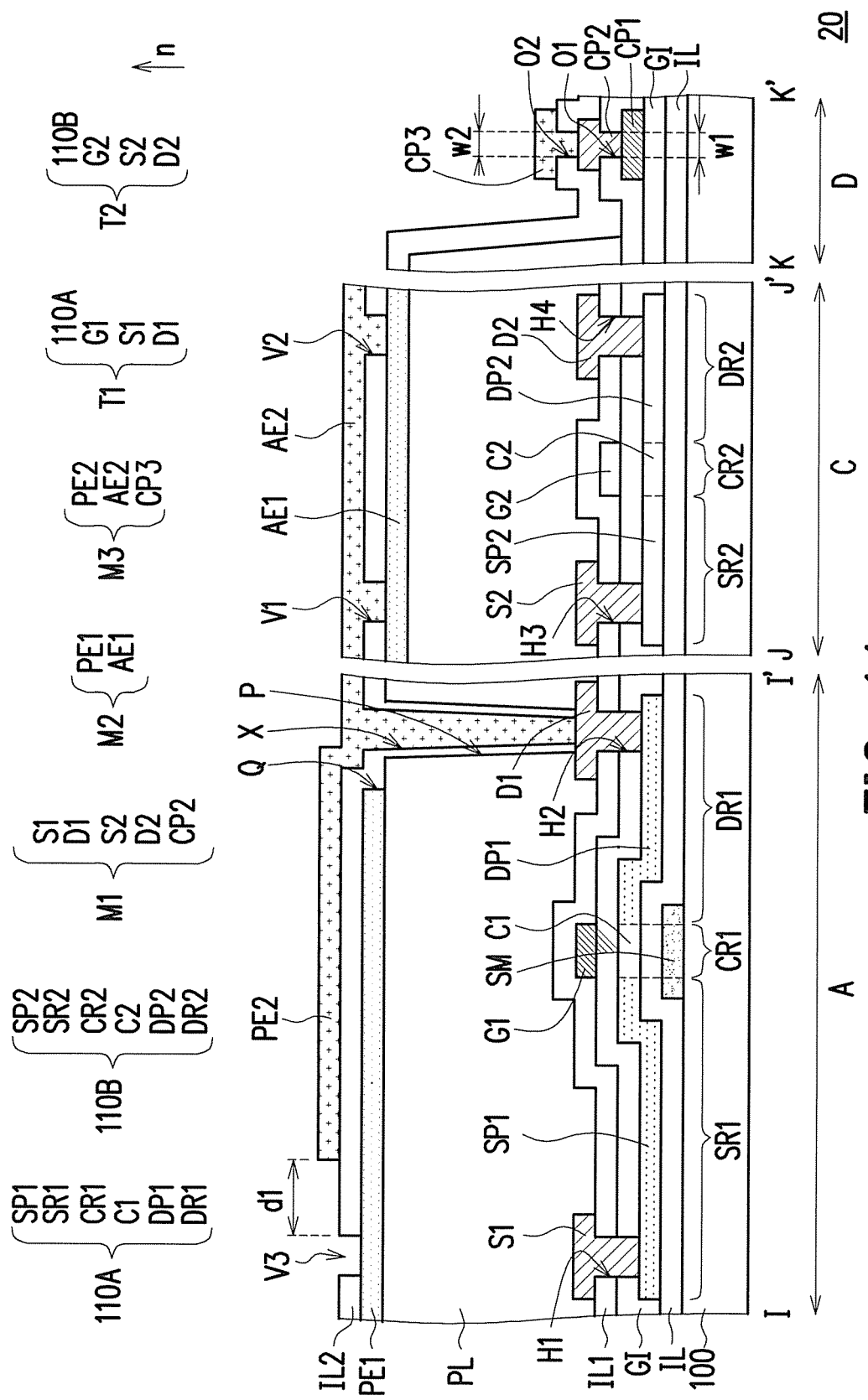
FIG. 14 is a schematic cross-sectional view of a portion of an array substrate according to another embodiment of the invention.

After the steps depicted in FIG. 11D, seven photolithography and etching processes are performed according to the steps in FIG. 2C to FIG. 2P so as to complete the fabrication of the array substrate 20 as shown in FIG. 14. Referring to FIG. 14 and FIG. 2P together, the array substrate 20 is similar to the array substrate 10, and a main difference therebetween lies in that: the array substrate 20 further includes the shielding layer SM and the insulation layer IL compared to the array substrate 10, and thus related descriptions of the remaining members can be referred to the foregoing embodiments and will not be further elaborated.

In the method for fabricating the array substrate 20, as the same photo mask is used to form the first contact hole H1, the second contact hole H2, the third contact hole H3, the fourth contact hole H4 and the at least one first bonding region opening O1 and to form the first opening V1, the second opening V2, the third opening V3, the via hole X, and the at least one second bonding region opening O2, only eight photo masks (i.e., the photo mask 200, the photo mask 210, the photo mask 220, the photo mask 230, the photo mask 240, the photo mask 250, the photo mask 260 and the photo mask 400) are thus required when performing nine photolithography and etching processes. Therefore, in the method for fabricating the array substrate 20, the number of the photo masks used is saved and fabricating costs are lowered.

In addition, in the array substrates 10 and 20 of the foregoing embodiments, the first auxiliary electrode AE1 included by the second conductor layer M2 and the second auxiliary electrode AE2 included by the third conductor layer M3 are disposed inside the driving circuit region C, wherein the first auxiliary electrode AE1 is located below the second interlayered insulation layer IL2 and is overlapped with the first opening V1 and the second opening V2 along the normal direction n, the second auxiliary electrode AE2 is located on the second interlayered insulation layer IL2 and is electrically connected to the first auxiliary electrode AE1 through the first opening V1 and the second opening V2, but the invention is not limited thereto. In other embodiments, only one auxiliary electrode or no auxiliary electrode may be disposed in the driving circuit region C.

Figure 15:
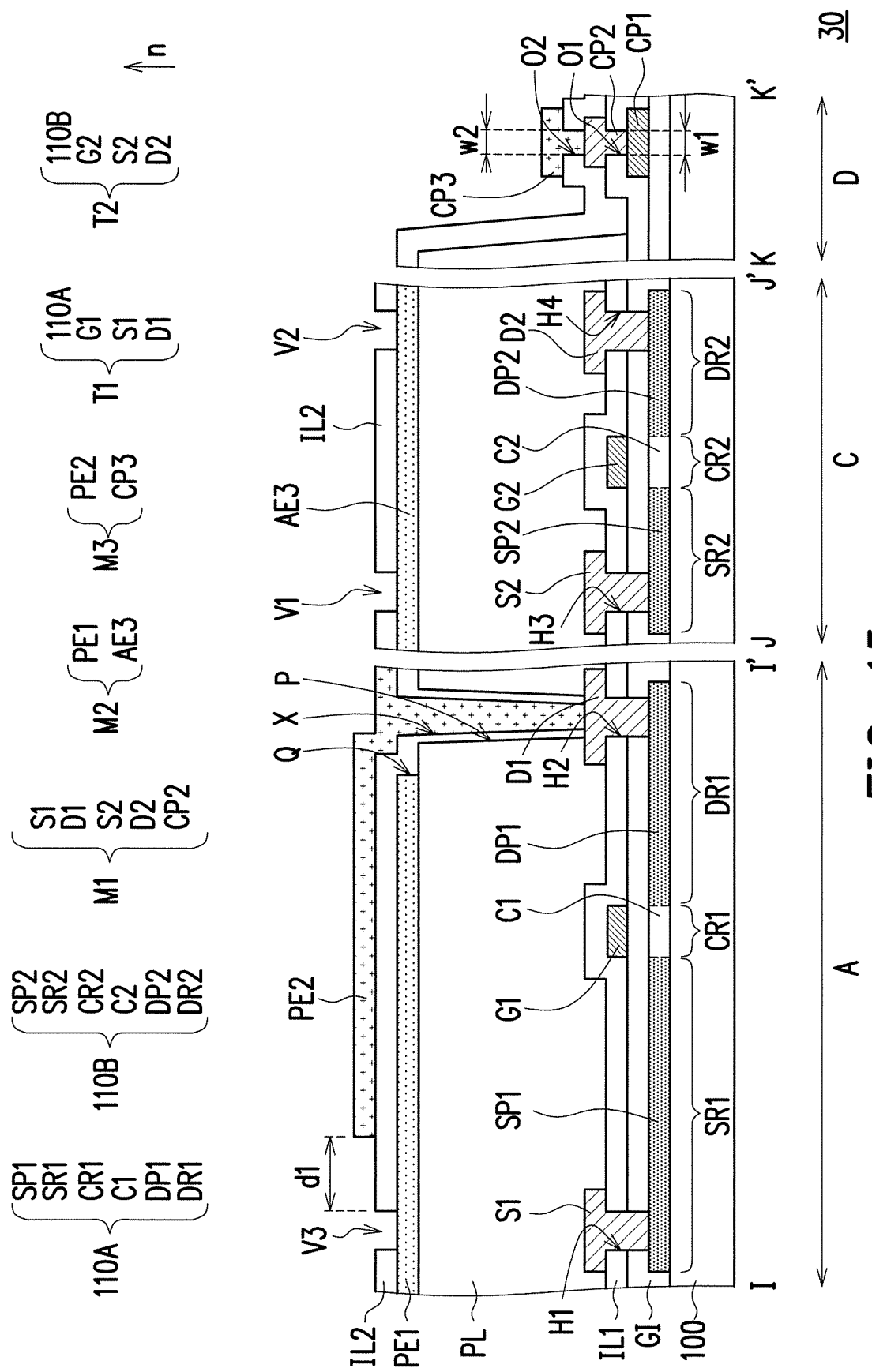
FIG. 15 is a schematic cross-sectional view of a portion of an array substrate according to another embodiment of the invention.
Figure 16:
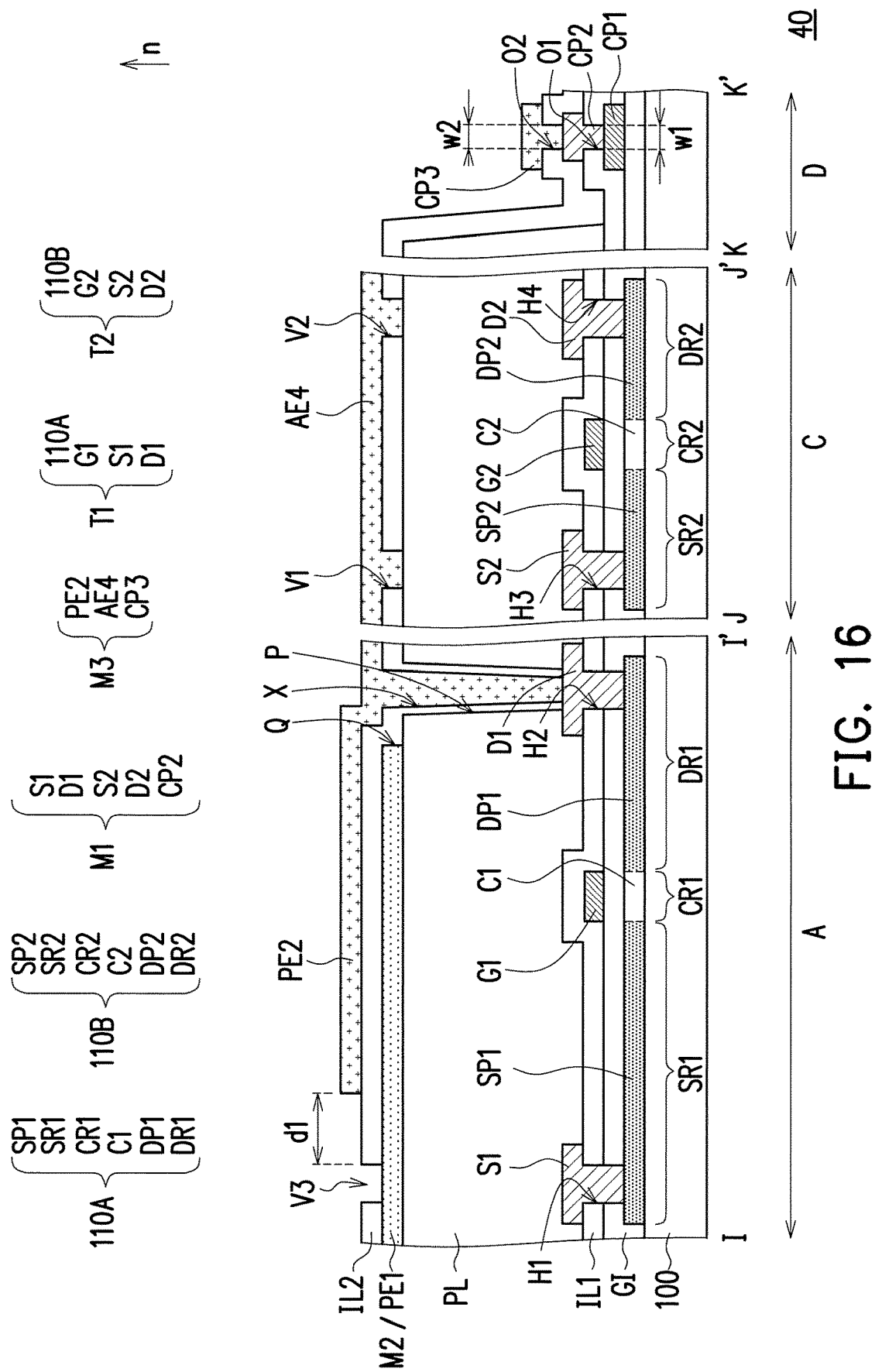
FIG. 16 is a schematic cross-sectional view of a portion of an array substrate according to another embodiment of the invention.
Figure 17:
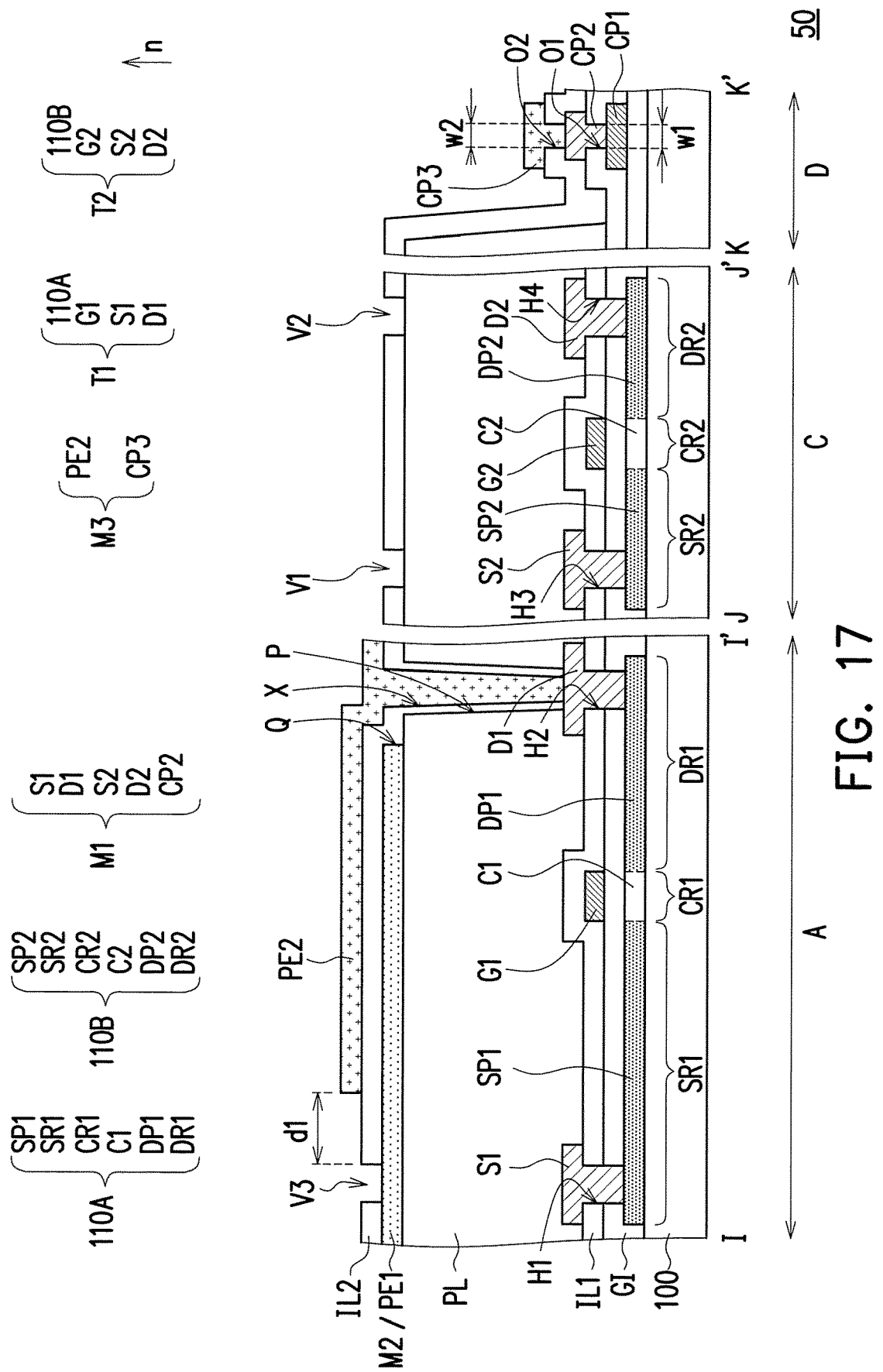
FIG. 17 is a schematic cross-sectional view of a portion of an array substrate according to another embodiment of the invention.

The following descriptions will be provided in regard to other embodiments as shown in FIG. 15, FIG. 16 and FIG. 17. It should be noted that the reference numerals and some descriptions provided in the previous embodiments are applicable in the following embodiments, in which identical or similar reference numerals indicate identical or similar elements, and repeated descriptions of the same technical contents are omitted. Please refer to the descriptions provided in the previous embodiments for the omitted contents, which will not be repeated hereinafter.

FIG. 15 is a schematic cross-sectional view of a portion an array substrate according to another embodiment of the invention. The schematic top view of the array substrate 30 of FIG. 15 is as that shown in FIG. 1, and cross-sectional positions of FIG. 15 respectively correspond to a sectional line I-I' of FIG. 3A to FIG. 10A, a sectional line J-J' of FIG. 3B to FIG. 10B, and a sectional line K-K' of FIG. 3C to FIG. 10C.

Referring to FIG. 15 and FIG. 2P together, the array substrate 30 is similar to the array substrate 10, and a main difference therebetween lies in a film layer structure in the driving circuit region C. Therefore, the following descriptions will be provided in regard to the differences therebetween, while similar or identical parts may be referred to the foregoing embodiments and will not be repeated hereinafter.

Referring to FIG. 15, the array substrate 30 includes a first auxiliary electrode AE3 located in the driving circuit region C, wherein the second interlayered insulation layer IL2 is located on the first auxiliary electrode AE3, and the first opening V1 and the second opening V2 are overlapped with the first auxiliary electrode AE3 along the normal direction n. In this embodiment, the first opening V1 and the second opening V2 respectively expose at least a portion of the first auxiliary electrode AE3. In this embodiment, as the first opening V1 and the second opening V2 are designed to be overlapped with the first auxiliary electrode AE3 along the normal direction n, the planarization layer PL located below the first auxiliary electrode AE3 is thereby prevented from being exposed to the atmospheric environment in which deterioration problem may occur resulted from moisture absorption.

In addition, in this embodiment, the first auxiliary electrode AE3 and the first pixel electrode PE1 located at the display region A constitute the second conductor layer M2. Namely, the first auxiliary electrode AE3 and the first pixel electrode PE1 are formed in the same photolithography and etching process. In addition, in this embodiment, the third conductor layer M3 includes the second pixel electrode PE2 located at the display region A and the third conductor pattern CP3 located at the bonding region D. The third conductor layer M3 may be not located in the driving circuit region C.

In the method for fabricating the array substrate 30, as the same photo mask is used to form the first contact hole H1, the second contact hole H2, the third contact hole H3, the fourth contact hole H4 and the at least one first bonding region opening O1 and to form the first to the first opening V1, the second opening V2, the third opening V3, the via hole X, and the at least one second bonding region opening O2, the effect of saving the number of photo masks used is thereby achieved, and fabricating costs are further lowered.

FIG. 16 is a schematic cross-sectional view of a portion an array substrate according to another embodiment of the invention. The schematic top view of the array substrate 40 of FIG. 16 is as that shown in FIG. 1, and cross-sectional positions of FIG. 16 respectively correspond to a sectional line I-I' of FIG. 3A to FIG. 10A, a sectional line J-J' of FIG. 3B to FIG. 10B, and a sectional line K-K' of FIG. 3C to FIG. 10C.

Referring to FIG. 16 and FIG. 2P together, the array substrate 40 is similar to the array substrate 10, and a main difference therebetween lies in the film layer structure in the driving circuit region C. Therefore, the following descriptions will be provided in regard to the differences therebetween, while similar or identical parts may be referred to the foregoing embodiments and will not be repeated hereinafter.

Referring to FIG. 16, the array substrate 40 includes a first auxiliary electrode AE4 located in the driving circuit region C, wherein the first auxiliary electrode AE4 is located on the second interlayered insulation layer IL2 and fills the first opening V1 and the second opening V2. In this embodiment, the first auxiliary electrode AE4 fills the first opening V1 and the second opening V2 and thus is in contact with the planarization layer PL.

In addition, in this embodiment, the first auxiliary electrode AE4, the second pixel electrode PE2 located at the display region A, and the third conductor pattern CP3 located at the bonding region D constitute the third conductor layer M3. The first auxiliary electrode AE4, the second pixel electrode PE2, and the third conductor pattern CP3 are formed in the same photolithography and etching process. Besides, in this embodiment, the second conductor layer M2 includes the first pixel electrode PE1 located at the display region A. The second conductor layer M2 is not located in the driving circuit region C nor the bonding region D as shown in FIG. 16.

In the method for fabricating the array substrate 40, as the same photo mask is used to form the first contact hole H1, the second contact hole H2, the third contact hole H3, the fourth contact hole H4 and the at least one first bonding region opening O1 and to form the first opening V1, the second opening V2, the third opening V3, the via hole X, and the at least one second bonding region opening O2, the effect of saving the number of photo masks used is thereby achieved, and fabricating costs are further lowered.

FIG. 17 is a schematic cross-sectional view of a portion an array substrate according to another embodiment of the invention. The schematic top view of the array substrate 50 of FIG. 17 is as that shown in FIG. 1, and cross-sectional positions of FIG. 17 respectively correspond to a sectional line I-I' of FIG. 3A to FIG. 10A, a sectional line J-J' of FIG. 3B to FIG. 10B, and a sectional line K-K' of FIG. 3C to FIG. 10C.

Referring to FIG. 17 and FIG. 2P together, the array substrate 50 is similar to the array substrate 10, and a main difference therebetween lies in the film layer structure in the driving circuit region C. Therefore, the following descriptions will be provided in regard to the differences therebetween, while similar or identical parts may be referred to the foregoing embodiments and will not be repeated hereinafter.

Referring to FIG. 17, in the array substrate 50, the first opening V1 and the second opening V2 located in the second interlayered insulation layer IL2 respectively expose at least a portion of the planarization layer PL. In addition, in this embodiment, the second conductor layer M2 includes the first pixel electrode PE1 located at the display region A; the third conductor layer M3 includes the second pixel electrode PE2 located at the display region A; and the third conductor pattern CP3 located at the bonding region D. In other words, in this embodiment, the second conductor layer M2 is not located in the driving circuit region C nor the bonding region D; and the third conductor layer M3 is not located in the driving circuit region C.

In the method for fabricating the array substrate 50, as the same photo mask is used to form the first contact hole H1, the second contact hole H2, the third contact hole H3, the fourth contact hole H4 and the at least one first bonding region opening O1 and to form he first opening V1, the second opening V2, the third opening V3, the via hole X, and the at least one second bonding region opening O2, the effect of saving the number of photo masks used is thereby achieved, and fabricating costs are further lowered.

In view of the foregoing, in the method for fabricating the array substrate of the aforesaid embodiments, the same photo mask is used to form the first to fourth contact holes and the at least one first bonding region opening and to form the first to third openings, the contact hole, and the at least one second bonding region opening, meaning that the same photo mask is used in two photolithography and etching processes. Therefore, in the method for fabricating the array substrate, the number of the photo masks used is saved and fabricating costs are lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An array substrate, the array substrate having a display region and a driving circuit region, and the array substrate comprising:
   an active element located at the display region, wherein the active element comprises a first active layer, a first gate, a first source and a first drain, wherein the first active layer has a first channel predetermined region, a first source doped predetermined region and a first drain doped predetermined region, the first gate and the first channel predetermined region are overlapped along a normal direction, the first source is in contact with the first source doped predetermined region, and the first drain is in contact with the first drain doped predetermined region;
   a driving element located at the driving circuit region, wherein the driving element comprises a second active layer, a second gate, a second source and a second drain, wherein the second active layer has a second channel predetermined region, a second source doped predetermined region and a second drain doped predetermined region, the second gate and the second channel predetermined region are overlapped along the normal direction, the second source is in contact with the second source doped predetermined region, and the second drain is in contact with the second drain doped predetermined region;
   a first interlayered insulation layer at least located at the display region;
   a first auxiliary electrode located at the driving circuit region; and
   a second interlayered insulation layer located above the active element and the driving element, wherein the second interlayered insulation layer has a first opening, a second opening corresponding to the driving circuit region, and a third opening corresponding to the display region, wherein the first opening and the second source are overlapped, the second opening and the second drain are overlapped, and the third opening and the first source are overlapped along the normal direction;
   a first pixel electrode located at the display region, wherein the third opening and the first pixel electrode are overlapped along the normal direction; and
   a second pixel electrode located at the display region, wherein the second interlayered insulation layer is located between the first pixel electrode and the second pixel electrode, wherein the second pixel electrode is electrically connected to the active element, wherein maximums width of the third opening, the first opening and the second opening are respectively equal to maximum widths of a first contact hole corresponding to the first source, a third contact hole corresponding to the second source, a fourth contact hole corresponding to the second drain.

2. An array substrate, the array substrate having a display region and a driving circuit region, and the array substrate comprising:
   an active element located at the display region, wherein the active element comprises a first active layer, a first gate, a first source and a first drain, wherein the first active layer has a first channel predetermined region, a first source doped predetermined region and a first drain doped predetermined region, the first gate and the first channel predetermined region are overlapped along a normal direction, the first source is in contact with the first source doped predetermined region, and the first drain is in contact with the first drain doped predetermined region;
   a driving element located at the driving circuit region, wherein the driving element comprises a second active layer, a second gate, a second source and a second drain, wherein the second active layer has a second channel predetermined region, a second source doped predetermined region and a second drain doped predetermined region, the second gate and the second channel predetermined region are overlapped along the normal direction, the second source is in contact with the second source doped predetermined region, and the second drain is in contact with the second drain doped predetermined region;
   a first interlayered insulation layer at least located at the display region;
   a first auxiliary electrode located at the driving circuit region; and a second interlayered insulation layer located above the active element and the driving element, wherein the second interlayered insulation layer has a first opening, a second opening corresponding to the driving circuit region, and a third opening corresponding to the display region, wherein the first opening and the second source are overlapped, the second opening and the second drain are overlapped, and the third opening and the first source are overlapped along the normal direction;

a first pixel electrode located at the display region, wherein the third opening and the first pixel electrode are overlapped along the normal direction; and a second pixel electrode located at the display region, wherein the second interlayered insulation layer is located between the first pixel electrode and the second pixel electrode, wherein the second pixel electrode is electrically connected to the active element, wherein centers of the third opening, the first opening and the second opening are respectively aligned with centers of a first contact hole corresponding to the first source, a third contact hole corresponding to the second source, a fourth contact hole corresponding to the second drain.

* * * * *